(12) United States Patent
Hsu et al.

(10) Patent No.: US 12,148,746 B2
(45) Date of Patent: Nov. 19, 2024

(54) INTEGRATED CIRCUIT AND METHOD OF MANUFACTURING SAME

(71) Applicant: TAIWAN SEMICONDUCTOR MANUFACTURING COMPANY, LTD., Hsinchu (TW)

(72) Inventors: Chia-Wei Hsu, Hsinchu (TW); Bo-Ting Chen, Hsinchu (TW); Jam-Wem Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 490 days.

(21) Appl. No.: 17/446,192

(22) Filed: Aug. 27, 2021

(65) Prior Publication Data
US 2023/0068882 A1   Mar. 2, 2023

(51) Int. Cl.
*H01L 27/02*   (2006.01)

(52) U.S. Cl.
CPC ............................... *H01L 27/0292* (2013.01)

(58) Field of Classification Search
None
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 10,497,677 B1* | 12/2019 | Karp | H01L 25/0657 |
| 2004/0136126 A1* | 7/2004 | Smith | H01L 27/0251 361/56 |
| 2006/0262469 A1* | 11/2006 | Khazhinsky | H01L 27/0292 361/56 |
| 2010/0237386 A1* | 9/2010 | Lin | H01L 23/60 257/E23.141 |
| 2014/0040838 A1 | 2/2014 | Liu et al. | |
| 2015/0278429 A1 | 10/2015 | Chang | |
| 2020/0035670 A1* | 1/2020 | Tsai | H02H 9/046 |
| 2020/0343237 A1* | 10/2020 | Karp | H01L 27/0255 |
| 2022/0415877 A1* | 12/2022 | Orr | H01L 21/823475 |

* cited by examiner

Primary Examiner — Benjamin P Sandvik
(74) Attorney, Agent, or Firm — Hauptman Ham, LLP

(57) ABSTRACT

An integrated circuit (IC) device includes a semiconductor substrate, a first connection tower, and one or more first front side conductors and one or more first front side metal vias. The semiconductor substrate includes a first semiconductor substrate segment having first functional circuitry and a second semiconductor substrate segment having a first electrostatic discharge (ESD) clamp circuit. The first connection tower connects to an input/output pad. The one or more first front side conductors and one or more first front side metal vias connect the first buried connection tower to the first functional circuitry in the first semiconductor substrate segment and to the first ESD clamp circuit in the second semiconductor substrate segment.

20 Claims, 20 Drawing Sheets

1116

1002
generate a layout diagram

1126
generate a second connection tower shape in a fifth region that has a long axis that extends in the first direction, the second connection tower shape configured to be biased at a first reference voltage

1128
generate one or more first conductor shapes and one or more first via shapes in a sixth region that has a long axis extends in a second direction that is transverse to the first direction, wherein the one or more first conductor shapes and the one or more first via shapes connect a first one of the first transistor driver shapes in the first array and a first one of the ESD clamp circuit shapes in the second array to the first connection tower shape

1130
generate one or more second conductor shapes and one or more second via shapes in a seventh region that has a long axis extends in the second direction, wherein the one or more second conductor shapes and the one or more second via shapes connect a first one of the ESD clamp circuit shapes in the third array to the second connection tower shape

FIG. 11D

INTEGRATED CIRCUIT AND METHOD OF MANUFACTURING SAME

BACKGROUND

The recent trend in miniaturizing integrated circuits (ICs) has resulted in smaller devices which consume less power, yet provide more functionality at higher speeds than before. The miniaturization process has also increased the devices' susceptibility to electrostatic discharge (ESD) events due to various factors, such as thinner dielectric thicknesses and associated lowered dielectric breakdown voltages. ESD is one of the causes of electronic circuit damage and is also one of the considerations in semiconductor advanced technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11C-11D are a flowchart of a method of generating a layout diagram, in accordance with some embodiments.

DETAILED DESCRIPTION

Figure 1:
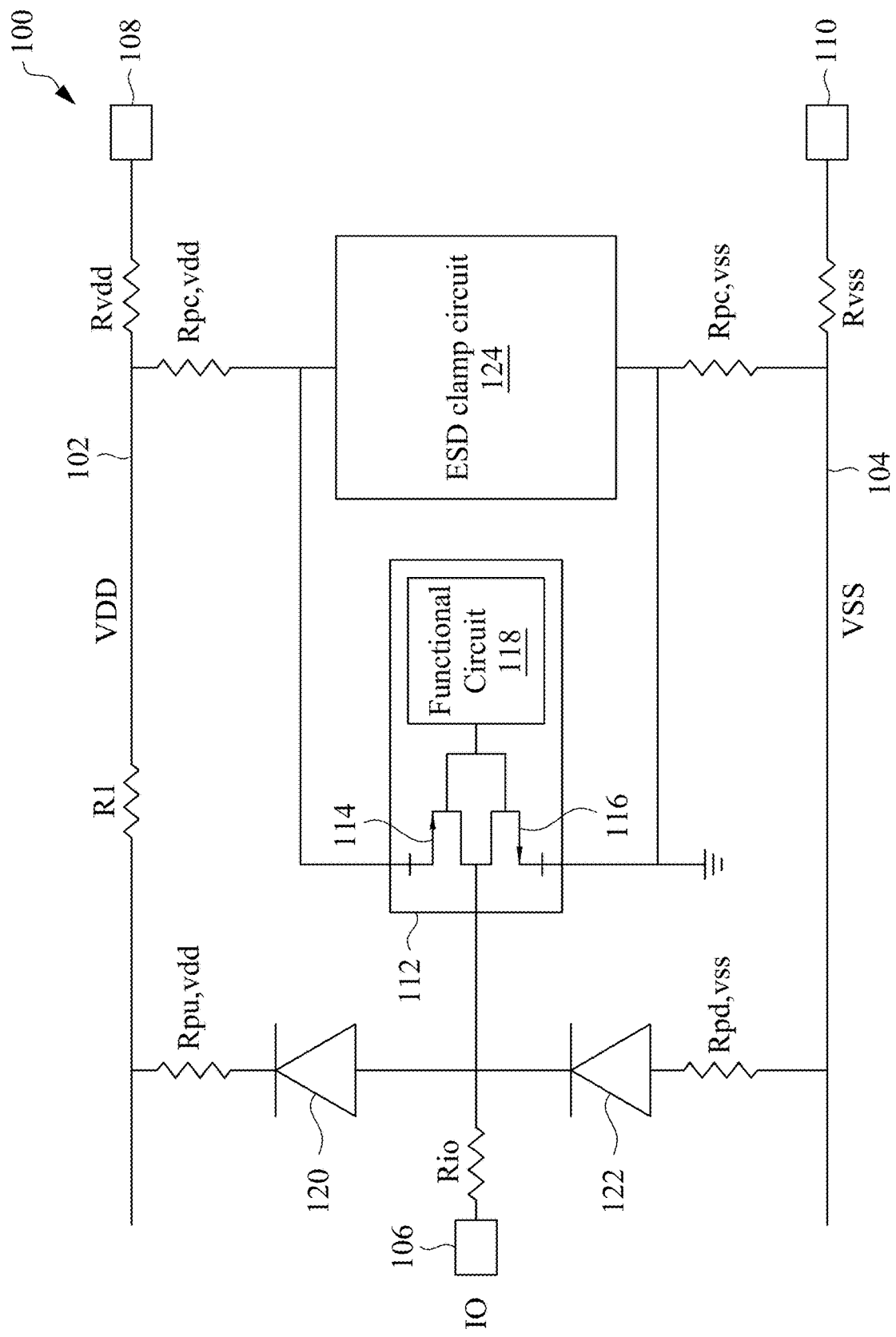
FIG. 1 is a circuit diagram of an integrated circuit (IC) device in accordance with one or more embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit (IC) device includes a semiconductor substrate, a first connection tower, and one or more first front side conductors and one or more first front side metal vias. The semiconductor substrate includes a first semiconductor substrate segment having first functional circuitry and a second semiconductor substrate segment having a first electrostatic discharge (ESD) clamp circuit. The first connection tower connects to an input/output pad. The one or more first front side conductors and one or more first front side metal vias connect the first buried connection tower to the first functional circuitry in the first semiconductor substrate segment and to the first ESD clamp circuit in the second semiconductor substrate segment. By utilizing the first connection tower common to both the first ESD clamp circuit and the functional circuit, a resistance presented in the ESD path is significantly reduced thereby allowing for harmless ESD discharging and protecting the functional circuitry, in one or more embodiments.

FIG. 1 is a block diagram of an IC device 100 in accordance with one or more embodiments.

IC device 100 includes a first front-side power supply rail 102, a first front-side ground reference rail 104, an input/output (I/O) terminal 106, a first back-side power terminal 108, and a second back-side power terminal 110. The first front-side power supply rail 102 and the first front-side ground reference rail 104 are each located on the front-side of the IC device 100 (i.e., above a semiconductor substrate). In some embodiments, the I/O terminal 106, the first back-side power terminal 108, and the second back-side power terminal 110 are each located on the back-side of the IC device 100 (i.e., beneath the semiconductor substrate).

It should be noted that throughout this disclosure, the term "buried" refers to components that are provided beneath a semiconductor substrate. In other words, components that are "buried" are components on a back side of an IC device below the semiconductor substrate. Thus, a "buried power rail" is a power rail below the substrate, and a "buried connection tower" is a connection structure that comprises at least one conductor below the substrate. A buried connection tower is electrically coupled to circuitry on the front-side of the IC device by a conductive through-substrate via that extends through the substrate. In some embodiments, a buried connection tower comprises multiple conductors that are substantially aligned and beneath the semiconductor substrate, wherein the conductors are connected to one another by vias. For the conductors to be substantially aligned, at least 50% of the horizontal cross sectional areas (cross sectional areas in an x-y plane) of the conductors should overlap the cross sectional area of the conductors above and/or below. Conductors and vias in a connection tower may be of any shape and of the same or different shapes.

A buried connection tower Rio is on the back side of the IC device 100 and connects the I/O terminal 106 to the components on the front-side of the IC device 100. Furthermore, a buried connection tower Rvdd is on the back side of the IC device 100 and connects the first back-side power terminal 108 to the components on the front-side of the IC device 100. Finally, a buried connection tower Rvss is on the back side of the IC device 100 and connects the second back-side power terminal 110 to the components on the front-side of the IC device 100.

In FIG. 1, the IC device 100 includes an internal circuit 112 electrically coupled between the first front-side power supply rail 102 in FIG. 1 and the first front-side ground reference rail 104. Furthermore, the internal circuit 112 is connected through the I/O terminal 106 in order to receive input and/or output signals that are external to the IC device 100. The internal circuit 112 includes a PMOS driver 114, an NMOS driver 116, and a functional circuit 118, which are provided in the semiconductor substrate and on the front-side of the IC device 100. The functional circuit 118 is an IC circuit that performs a particular function or functions. For example, the functional circuit 118 includes memory, combinational logic, sequential devices, sequential state components, digital processing circuits, RF circuits, and/or the like. In some embodiments, the PMOS driver 114 and the NMOS driver 116 are configured to convert signals of a lower voltage level of the functional circuit 118 to corresponding signals of a higher voltage level at the I/O terminal 106, or vice versa. In some embodiments, the PMOS driver 114 and the NMOS driver 116 are omitted. A buried connection tower is utilized to connect the I/O terminal 106 to the internal circuit 112 and is represented by the resistor Rio.

To protect the internal circuit 112 from electrostatic events, the IC device 100 includes an ESD clamp circuit 120, an ESD clamp circuit 122, and an ESD clamp circuit 124. The ESD clamp circuit 120, ESD clamp circuit 122, and the ESD clamp circuit 124 prevent the coupling of excessive electrostatic buildup from discharging into the internal circuit 112 and instead harmlessly discharge the electrostatic energy to the rails 102, 104. More specifically, the ESD clamp circuit 120, ESD clamp circuit 122, and the ESD clamp circuit 124 help prevent the internal circuit 112 from becoming damaged by bypassing positive or negative electrostatic current through a lower resistance path under various possible ESD discharge events between the I/O terminal 106, the first back-side power terminal 108 and the second back-side power terminal 110. The buried connection tower Rio is connected to the ESD clamp circuit 120 and the ESD clamp circuit 122. However, because no other buried connection tower other than buried connection tower Rio connects the IO terminal 106 to the internal circuit 112 (including the functional circuit 118), the resistance for discharging electrostatic energy from the internal circuit 112 to the rails 102, 104 is significantly reduced.

The ESD clamp circuit 120 is connected between the buried connection tower Rio and the first front-side power supply rail 102. The ESD clamp circuit 120 is configured to discharge electrostatic current from the internal circuit 112 or the I/O terminal 106 to the first front-side power supply rail 102. Thus, the ESC clamp circuit 120 is referred to as a Pull-Up (PU) ESD clamp circuit. In some embodiments, the ESD clamp circuit 120 includes a diode having the anode of the diode connected to the buried connection tower Rio and a cathode of the diode connected to front-side conductors and vias that is represented by the resistor Rpu, vdd. The front-side conductors and vias Rpu, vdd are connected between the cathode of the diode and the first front-side power supply rail 102. The resistance of the first front-side power supply rail 102 is presented by a resistor R1. Because no other buried connection tower other than the buried connection tower Rio connects the I/O terminal 106 to the anode of the diode in the ESD clamp circuit 120, the total resistance from the I/O terminal 106 through the first front-side power supply rail 102 is reduced.

The ESD clamp circuit 122 is connected between the buried connection tower Rio and the first front-side ground reference rail 104. The ESD clamp circuit 122 is configured to discharge electrostatic current to the first front-side ground reference rail 104 from the ESD clamp circuit 120 and from the I/O terminal 106. The ESD clamp circuit 122 is referred to as a pull down (PD) ESD clamp circuit. In some embodiments, the ESD clamp circuit 122 includes a diode having the anode of the diode connected to front-side conductors and vias that is represented by the resistor Rpd, vss. The front-side conductors and vias Rpd, vss are connected between the first front-side ground reference rail 104 and the anode of the diode in the ESD clamp circuit 122. The cathode of the diode in the ESD clamp circuit 122 is connected to the buried connection tower Rio, the internal circuit 112, and the anode of the diode in the ESD clamp circuit 120. Because no other buried connection tower other than the buried connection tower Rio connects the internal circuit 112 and the I/O terminal 106 to the cathode of the diode in the ESD clamp circuit 122, the total resistance from the I/O terminal 106 through the first front-side ground reference rail 104 is reduced as no other buried connections are required to connect to the cathode of the diode. It should be noted that in other embodiments, the ESD clamp circuits 120, 122 include film on die (FOD) or drain ballasted metal-oxide-semiconductor (MOS) to discharge current in dual directions. In some embodiments, ESD clamp circuits 120, 122 are provided in the semiconductor substrate.

The ESD clamp circuit 120 is configured to block electrostatic current from the first front-side power supply rail 102 toward the internal circuit 112 or the I/O terminal 106. The ESD clamp circuit 122 is configured to discharge electrostatic current from the first front-side ground reference rail 104 toward the ESD clamp circuit 120. The ESD clamp circuit 122 is configured to block electrostatic current from the I/O terminal 106 toward the first front-side ground reference rail 104. In some embodiments, the ESD clamp circuit 122 is provided in the semiconductor substrate.

A power source is connected at the first back-side power terminal 108 in order to bias the first front-side power supply rail 102 at a power supply voltage VDD. In other embodiments, the first front-side power supply rail 102 is connected in another manner to the power supply voltage VDD or is supplied by a different type of power device other than a power source. A resistance of a buried connection tower that connects the first back-side power terminal 108 to the first front-side power supply rail 102 is represented by the resistor Rvdd. Additionally, the first front-side ground reference rail 104 is connected to ground by the second back-side power terminal 110. A resistance of a buried connection tower that connects the second back-side power terminal 110 to the first front-side ground reference rail 104 is represented by the resistor Rvss. In other embodiments, the first front-side ground reference rail 104 is not a ground reference rail but a negative voltage rail that receives a negative voltage. For example, the first front-side ground reference rail 104 is coupled to a reference power source at the second back-side power terminal 110 where the reference power source is at a voltage level lower than those of first front-side power supply rail 102 and ground.

ESD clamp circuit 124 is connected between first front-side power supply rail 102 and first front-side ground reference rail 104 and configured to provide a conductive path between first front-side power supply rail 102 and first front-side ground reference rail 104 when an ESD event occurs on first front-side power supply rail 102. The ESD clamp circuit 124 is referred to as a power grid (PG) ESD clamp circuit. In some embodiments, the ESD clamp circuit 124 is provided in the semiconductor substrate, as explained in further detail below. The ESD clamp circuit 124 is connected to the first front-side power supply rail 102 by a front-side conductors and vias represented by the resistor Rpc, vdd. In some embodiments, the front-side conductors and vias Rpc, vdd is provided by front side metal conductors and vias. Furthermore, in the example configuration of FIG. 1, the internal circuit 112 does not connect directly to the first front-side power supply rail 102 but connects to the first front-side power supply rail 102 through the front-side conductors and vias Rpc, vdd. Other configurations are within the scopes of various embodiments.

Additionally, the ESD clamp circuit 124 is connected to the first front-side ground reference rail 104 by front-side conductors and vias represented by the resistor Rpc, vss. In some embodiments, the front-side conductors and vias Rpc, vss are corresponding front side metal conductors and vias. Furthermore, in the example configuration of FIG. 1, the internal circuit 112 does not connect directly to the first front-side ground reference rail 104, but connects to the first front-side power supply rail 102 through the front-side conductors and vias Rpc, vss. Other configurations are within the scopes of various embodiments. The ESD clamp circuit 124 is configured to discharge ESD current between the first front-side power supply rail 102 and the first ground reference rail 102. Note that no other connection routing other than the front-side conductors and vias Rpc, vdd is used to connect the ESD clamp circuit 124 to the first front-side power supply rail 102 and no other connection routing other than the front-side conductors and vias Rpc, vss is used to connect the ESD clamp circuit 124 to the first front-side ground reference rail 104. This significantly reduces the resistance presented to electrostatic current. In some embodiments, ESD clamp circuit 124 include diodes connected in parallel but with opposite polarities, FOD or drain ballasted MOS to discharge current in dual directions.

Figure 2:
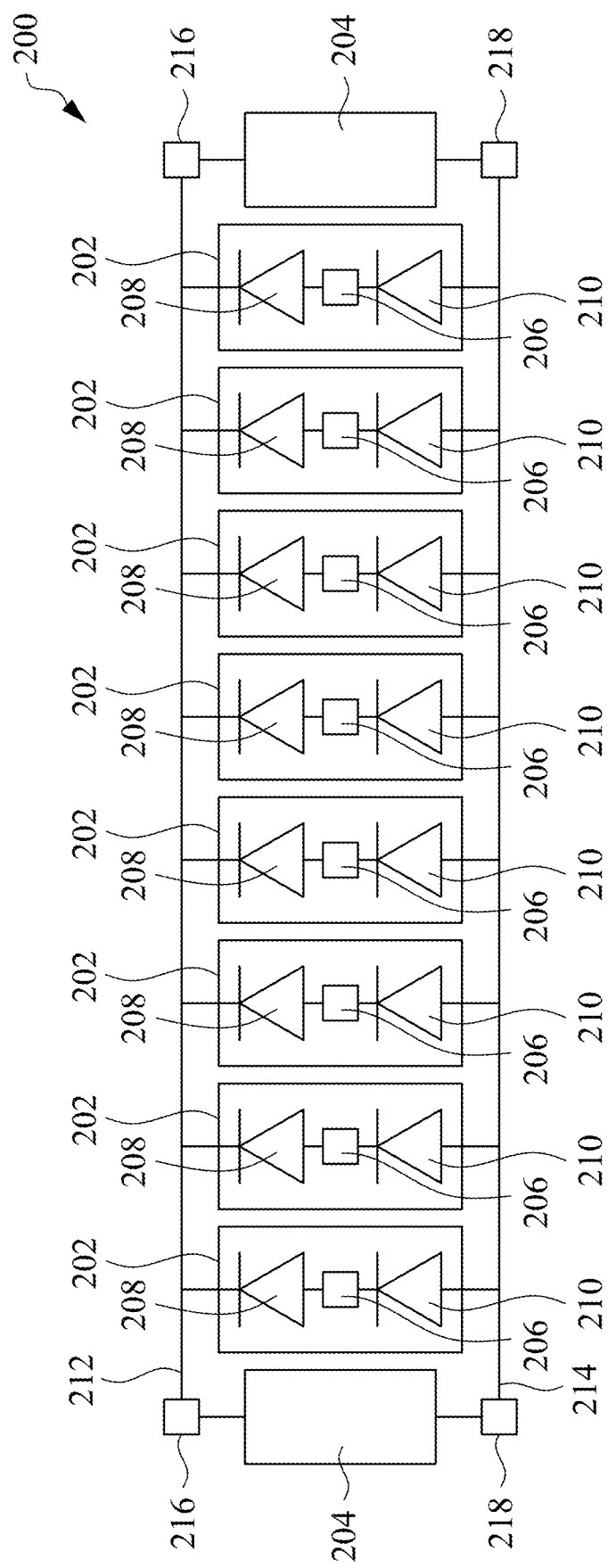
FIG. 2 is a circuit diagram of an IC device in accordance with one or more embodiments.

FIG. 2 is a circuit diagram of an IC device 200 in accordance with some embodiments.

The IC device 200 includes an array of IC modules 202 and a pair of ESD clamp circuits 204 at oppositely disposed ends of the array of IC modules 202. Each of the IC modules 202 includes an internal circuit 206 (which is similar to the internal circuit 112 of FIG. 1), a PU ESD clamp circuit 208 (which is similar to the ESD clamp circuit 120 of FIG. 1) and a PD ESD clamp circuit 210 (which is similar to the ESD clamp circuit 122 of FIG. 1). Each of the ESD clamp circuits 204 corresponds to the PG ESD clamp circuit 124 of FIG. 1. One or more internal circuits (not shown) have a functional circuit (similar to the functional circuit 118 of FIG. 1) and are connected to I/O terminals 216 within each of the IC modules 202. In some embodiments, the function of each of the functional circuit in each of the internal circuits is the same and in other embodiments, the function of at least some of the functional circuits in the internal circuits is different. In some embodiments, I/O terminal 216 is provided for each or at least some of the internal circuit(s) that is similar to the I/O terminal 106 shown in FIG. 1. The IC device 200 includes a first power supply rail 212 (which is similar to the back-side power supply rail or pad 108) and a first ground reference rail 214 (which is similar to the back-side ground reference rail or pad 110). In some embodiments, the first power supply rail 212 corresponds to the first front-side power supply rail 102 in FIG. 1 and the first ground reference rail 214 corresponds with first front-side ground reference rail 104 in FIG. 1. In some embodiments, the first power supply rail 212 is a buried power supply rail and the first ground reference rail 214 is a buried ground reference rail. By providing an ESD clamp circuit 208 and an ESD clamp circuit 210 in each of the IC modules 202, electrostatic current can be discharged from an I/O terminal 216 of each of the internal circuits to the rails 212, 214.

The first power supply rail 212 is configured to receive a power source voltage, such as the power source voltage VDD, described above in FIG. 1. The first ground reference rail 214 is configured to receive a reference voltage, such as the reference voltage VSS, described above in FIG. 1. In some embodiments, the reference voltage VSS is a ground voltage.

The ESD clamp circuits 204 are each similar to the ESD clamp circuit 124 shown in FIG. 1. Each of the ESD clamp circuits 204 is connected, through power pads 216, 218, between the rails 212, 214 at opposite ends of the array of IC modules 202. The ESD clamp circuits 204 are thereby configured to transmit electrostatic current between the rails 212, 214.

Figure 3:
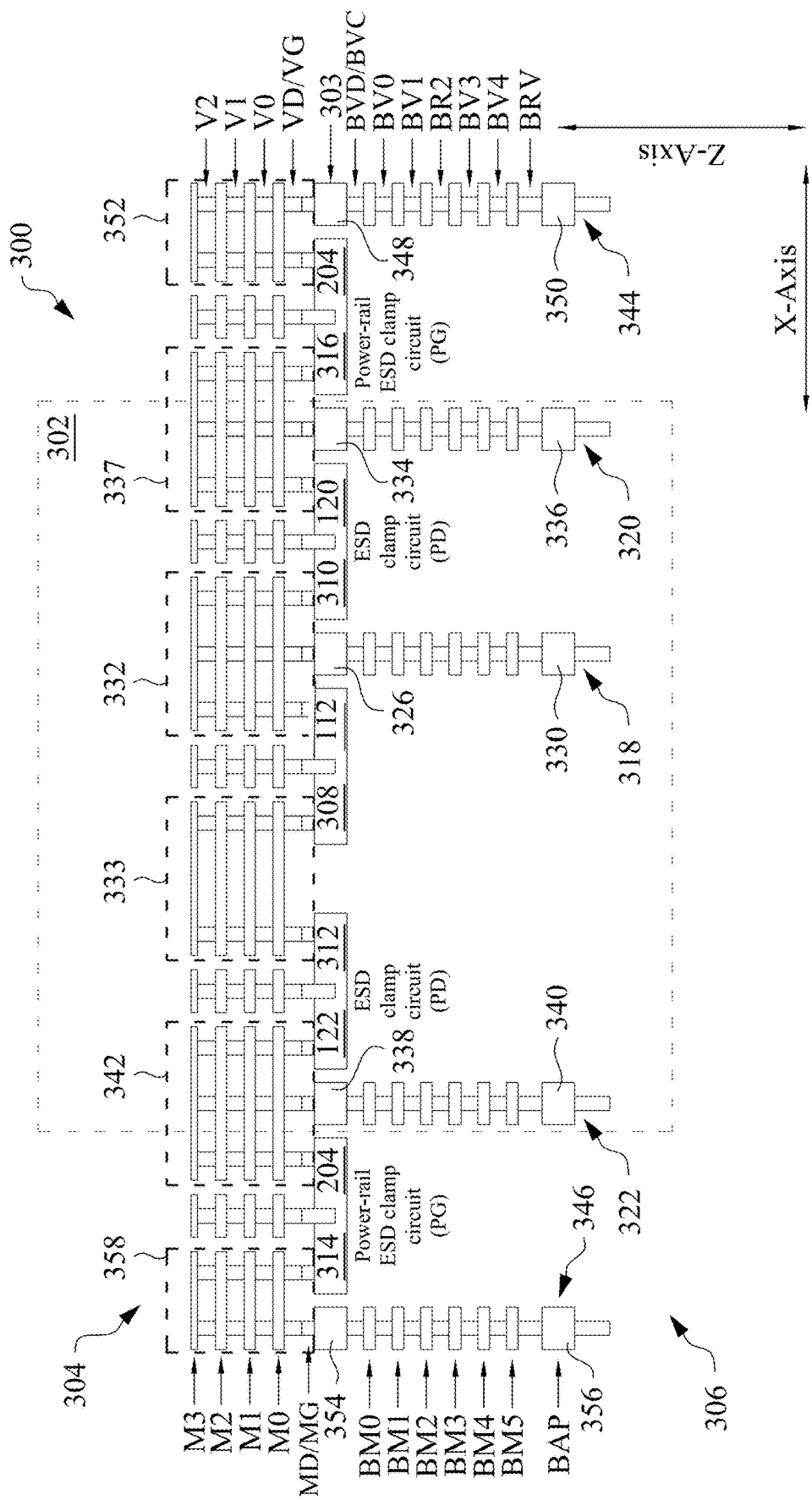
FIG. 3 is a cross sectional view of an IC device in accordance with some embodiments.

FIG. 3 is a cross sectional view of an IC device 300 in accordance with some embodiments.

The IC device 300 includes an IC module 302 and PG ESD clamp circuit 204. The IC module 302 is similar to any one of the IC modules 202 shown in FIG. 2. The cross sectional view is shown relative to an X-axis, which is a horizontal direction, and a third direction that is parallel with the Z-axis, which is a vertical direction. A Y-axis (not explicitly shown) extends into the page. The X-axis, the Y-axis, and the Z-axis are each orthogonal to one another.

The IC device 300 includes a semiconductor substrate 303 that extends in a first direction that is parallel to the X-axis and in a second direction that is parallel to the Y-axis and has a thickness in a third direction that is parallel to the Z-axis. In a direction that is positive with respect to Z-axis over the semiconductor substrate 303, the semiconductor substrate 303 has a front side 304. In a direction that is negative with respect to the Z-axis beneath the semiconductor substrate 303, the semiconductor substrate 303 has a buried side 306. Routing and connections are provided at the front side 304 and at the buried side 306 of the semiconductor substrate 303. The buried side 306 is sometimes referred to as the "back side."

On the front side 304 above semiconductor substrate 303, IC module 302 further includes front side layers. The front side layers include: a contact-to-transistor-component layer (MD/MG layer); a via-between-contact-and-metallization layer (VD/VG layer); a first layer of metallization (M0 layer); a first layer of interconnection (V0 layer); a second layer of metallization (M1 layer); a second layer of interconnection (V1 layer); a third layer of metallization (M2 layer); a third layer of interconnection (V2 layer); and a fourth layer of metallization (M3 layer). In some embodiments, additional metallization layers (not explicitly shown) and interconnection layers (not explicitly shown) are provided in the front side 304 while in other embodiments fewer metallization layers and fewer interconnection layers are provided in the front side 304.

Relative to the Z-axis, and below the semiconductor substrate 303 on the buried side, cross-section, IC module 302 further includes buried layers. The buried layers include: a buried contact-to-transistor-component layer (BVD/BVG); a first buried layer of metallization (BM0 layer); a first buried layer of interconnection (BV0 layer); a second buried layer of metallization (BM1 layer); a second buried layer of interconnection (BV1 layer); a third buried layer of metallization (BM2 layer); a third buried layer of interconnection (BV2 layer); a fourth buried layer of metallization (BM3 layer); a fourth buried layer of interconnection (BV3 layer); a fifth buried layer of metallization (BM4 layer); a fifth buried layer of interconnection (BV4 layer); a sixth buried layer of metallization (BM5 layer); a buried redistribution layer (BRV layer); and a buried pad layer (BAP layer).

In this example, the semiconductor substrate 303 includes a semiconductor substrate segment 308. An internal circuit, such as the internal circuit 112 described above in FIG. 1, is formed in the semiconductor substrate segment 308. In some embodiments, the entire internal circuit 112 is provided in the semiconductor substrate segment 308. In other embodiments, the functional circuit 118 is provided in the semiconductor substrate segment 308 and the PMOS driver 114 and the NMOS driver 116 are provided in different semiconductor substrate segments. The input/output circuit 112 is in the module 302.

The semiconductor substrate 303 further includes a semiconductor substrate segment 310. The semiconductor substrate segment 310 includes the PU ESD clamp circuit 120 described above with respect to FIG. 1, which is in the module 302. The semiconductor substrate 303 further includes a semiconductor substrate segment 312. The semiconductor substrate segment 312 includes a PD ESD clamp circuit 122. The PD ESD clamp circuit 122 corresponds to one of the PD clamp circuits 210 of FIG. 2.

The semiconductor substrate 303 further includes a semiconductor substrate segment 314. The semiconductor substrate segment 314 is the leftmost semiconductor substrate segment relative to the X-axis. The semiconductor substrate segment 314 includes a PG ESD clamp circuit 204, which corresponds to the PG ESD clamp circuit 124. Additionally, the semiconductor substrate 303 further includes a semiconductor substrate segment 316. The semiconductor substrate segment 316 is the right most semiconductor substrate segment relative to the X-axis. The semiconductor substrate segment 316 includes another PG ESD clamp circuit 204, which also corresponds to the PG ESD clamp circuit 124 in FIG. 1.

The IC module 302 includes buried connection towers 318, 320, 322. A topmost portion of the buried connection tower 318 is provided by a semiconductor substrate segment 326 (to the right of the semiconductor substrate segment 308 in the semiconductor substrate 303). The buried connection tower 318 includes contacts in the BVD/BVG layer that connect to a conductor in the buried metallization layer BM0. The buried connection tower 318 includes conductors in each of the buried metallization layers BM0-BM5 that are connected by vias or via towers in buried interconnection layers BV0-BV4. Contacts in the buried redistribution layer BRV layer connect the conductor in the buried metallization layer BM5 to an input/output pad 330 in the BAP layer. The input/output pad 330 is at the bottommost portion of the buried connection tower 318 and is utilized to receive and transmit input/output signals. In some embodiments, the buried connection tower 318 corresponds to the resistor Rio, and the input/output pad 330 corresponds to the I/O terminal 106, as described with respect to FIG. 1.

To connect the buried connection tower 318 to the internal circuit 112 and to the PU ESD clamp circuit 120, front side conductors and front side metal vias (referred to collectively with element number 332) are on the front side 304 in metallization layers MD/MG, M0-M3, VD/VG, and interconnection layers V0-V2. Thus, front side conductors and front side metal vias 332 provide a connection from the buried connection tower 318 to both the internal circuit 112 in semiconductor substrate segment 308 and to the PU ESD clamp circuit 120 in semiconductor substrate segment 310. No other buried connection tower other than the buried connection tower 318 connects the input/output pad 330 to the internal circuit 112 in the semiconductor substrate segment 308 and to the PU ESD clamp circuit 120 in the semiconductor substrate segment 310. Accordingly, this significantly reduces the resistance between the input/output pad 330 and the PU ESD clamp circuit 120.

To connect the buried connection tower 318 to the internal circuit 112 and to the PD ESD clamp circuit 122, front side conductors and front side metal vias (referred to collectively with element number 333) are on the front side 304 in metallization layers MD/MG, M0-M3, VD/VG, and interconnection layers V0-V2. Thus, front side conductors and front side metal vias 333 provide a connection from the buried connection tower 318 to both the internal circuit 112 in semiconductor substrate segment 308 and to the PD ESD clamp circuit 122 in semiconductor substrate segment 312. No other buried connection tower other than the buried connection tower 318 connects the input/output pad 330 to the internal circuit 112 in the semiconductor substrate segment 308 and to the PD ESD clamp circuit 122 in the semiconductor substrate segment 312. Accordingly, this significantly reduces the resistance between the input/output pad 330 and the PD ESD clamp circuit 122.

The buried connection tower 320 is to the right of the semiconductor substrate segment 310, which includes the PU ESD clamp circuit 120. A topmost portion of the buried connection tower 320 is provided by a semiconductor substrate segment 334. The buried connection tower 320 includes a contact in the BVD/BVG layer that connects to a conductor in the buried metallization layer BM0. The buried connection tower 320 includes conductors in each of the buried metallization layers BM0-BM5 that are connected by vias or via towers in buried interconnection layers BV0-BV4. A contact in the buried redistribution layer BRV layer connects the conductor in the buried metallization layer BM5 to a power pad 336 in the BAP layer. The power pad 336 is at the bottommost portion of the buried connection tower 320 and is utilized to receive a reference voltage VDD, which is a power source voltage. In some embodiments, the buried connection tower 320 corresponds to the resistor Rvdd, and the power pad 336 corresponds to the back-side power supply rail or pad 108, as described with respect to FIG. 1.

To connect the buried connection tower 320 to the PU ESD clamp circuit 120 and to the PG ESD clamp circuit 204 on the right, front side conductors and front side metal vias (referred to collectively with element number 337) are on the front side 304 in metallization layers MD/MG, M0-M3, VD/VG, and interconnection layers V0-V2. Thus, front side conductors and front side metal vias 337 provide a connection from the buried connection tower 320 to both the PU ESD clamp circuit 120 in semiconductor substrate segment 310 and to the PG ESD clamp circuit 204 on the right in semiconductor substrate segment 316. No other buried connection tower other than the buried connection tower 320 connects the power pad 336 to the PU ESD clamp circuit 120 in the semiconductor substrate segment 310 and to the PG ESD clamp circuit 204 in the semiconductor substrate segment 316. Accordingly, this significantly reduces the resistance between the power pad 336, the PU ESD clamp circuit 120, and the PG ESD clamp circuit 204. Power pad 336 corresponds to power pad 108 in FIG. 1 and to one of the power pads 216 in FIG. 2.

The buried connection tower 322 is to the left of the semiconductor substrate segment 310, which includes the PD ESD clamp circuit 122. A topmost portion of the buried connection tower 322 is provided by a semiconductor substrate segment 338. The buried connection tower 322 includes a contact in the BVD/BVG layer that connects to a conductor in the buried metallization layer BM0. The buried connection tower 322 includes conductors in each of the buried metallization layers BM0-BM5 that are connected by vias or via towers in buried interconnection layers BV0-BV4. A contact in the buried redistribution layer BRV layer connects the conductor in the buried metallization layer BM5 to a power pad 340 in the BAP layer. The power pad 340 is at the bottommost portion of the buried connection tower 322 and is utilized to receive a reference voltage VSS, which is a ground voltage. In some embodiments, the buried connection tower 322 corresponds to the resistor Rvss, and the power pad 340 corresponds to the back-side ground reference rail or pad 110, as described with respect to FIG. 1.

To connect the buried connection tower 322 to the PD ESD clamp circuit 122 and to the PG ESD clamp circuit 204 on the left, front side conductors and front side metal vias (referred to collectively with element number 342) are on the front side 304 in metallization layers MD/MG, M0-M3, VD/VG, and interconnection layers V0-V2. Thus, front side conductors and front side metal vias 342 provide a connection from the buried connection tower 322 to both the PD ESD clamp circuit 122 in semiconductor substrate segment 312 and to the PG ESD clamp circuit 204 on the right in semiconductor substrate segment 314. No other buried connection tower other than the buried connection tower 322 connects the power pad 340 to the PD ESD clamp circuit 122 in the semiconductor substrate segment 312 and to the PG ESD clamp circuit 204 in the semiconductor substrate segment 314. Accordingly, this significantly reduces the resistance between the power pad 340, the PD ESD clamp circuit 122, and the PG ESD clamp circuit 204. Power pad 340 corresponds to power pad 110 in FIG. 1 and to one of the power pads 218 in FIG. 2.

A buried connection tower 344 and a buried connection tower 346 are located outside the module 302. The buried connection tower 344 is to the right of the semiconductor substrate segment 316, which includes the PG ESD clamp circuit 204 on the right. A topmost portion of the buried connection tower 344 is provided by a semiconductor substrate segment 348. The buried connection tower 344 includes a contact in the BVD/BVG layer that connects to a conductor in the buried metallization layer BM0. The buried connection tower 344 includes conductors in each of the buried metallization layers BM0-BM5 that are connected by vias or via towers in buried interconnection layers BV0-BV4. A contact in the buried redistribution layer BRV layer connects the conductor in the buried metallization layer BM5 to a power pad 350 in the BAP layer. The power pad 350 is at the bottommost portion of the buried connection tower 344 and is utilized to receive the reference voltage VSS, which is the ground voltage. The power pad 350 represents the power pad 110 in FIG. 1 and one of the power pads 218 in FIG. 2.

To connect the buried connection tower 344 to the PG ESD clamp circuit 204 on the right, front side conductors and front side metal vias (referred to collectively with element number 352) are on the front side 304 in metallization layers MD/MG, M0-M3, VD/VG, and interconnection layers V0-V2. Thus, front side conductors and front side metal vias 352 provide a connection from the buried connection tower 344 to the PG ESD clamp circuit 204 on the right in semiconductor substrate segment 316. No other buried connection tower other than the buried connection tower 344 connects the power pad 350 to the PG ESD clamp circuit 204 in the semiconductor substrate segment 316. Accordingly, this significantly reduces the resistance between the power pad 350 and the PG ESD clamp circuit 204.

The buried connection tower 346 is to the left of the semiconductor substrate segment 314, which includes the PG ESD clamp circuit 204 on the right. A topmost portion of the buried connection tower 346 is provided by a semiconductor substrate segment 354. The buried connection tower 346 includes a contact in the BVD/BVG layer that connects to a conductor in the buried metallization layer BM0. The buried connection tower 346 includes conductors in each of the buried metallization layers BM0-BM5 that are connected by vias or via towers in buried interconnection layers BV0-BV4. A contact in the buried redistribution layer BRV layer connects the conductor in the buried metallization layer BM5 to a power pad 356 in the BAP layer. The power pad 356 is at the bottommost portion of the buried connection tower 346 and is utilized to receive the reference voltage VDD, which is the power source voltage. The power pad 356 represents the power pad 108 in FIG. 1 and one of the power pads 216 in FIG. 2.

To connect the buried connection tower 346 to the PG ESD clamp circuit 204 on the left, front side conductors and front side metal vias (referred to collectively with element number 358) are on the front side 304 in metallization layers MD/MG, M0-M3, VD/VG, and interconnection layers V0-V2. Thus, front side conductors and front side metal vias 358 provide a connection from the buried connection tower 346 to the PG ESD clamp circuit 204 on the left in semiconductor substrate segment 314. No other buried connection tower other than the buried connection tower 346 connects the power pad 356 to the PG ESD clamp circuit 204 in the semiconductor substrate segment 314. Accordingly, this significantly reduces the resistance between the power pad 356 and the PG ESD clamp circuit 204.

Figure 4:
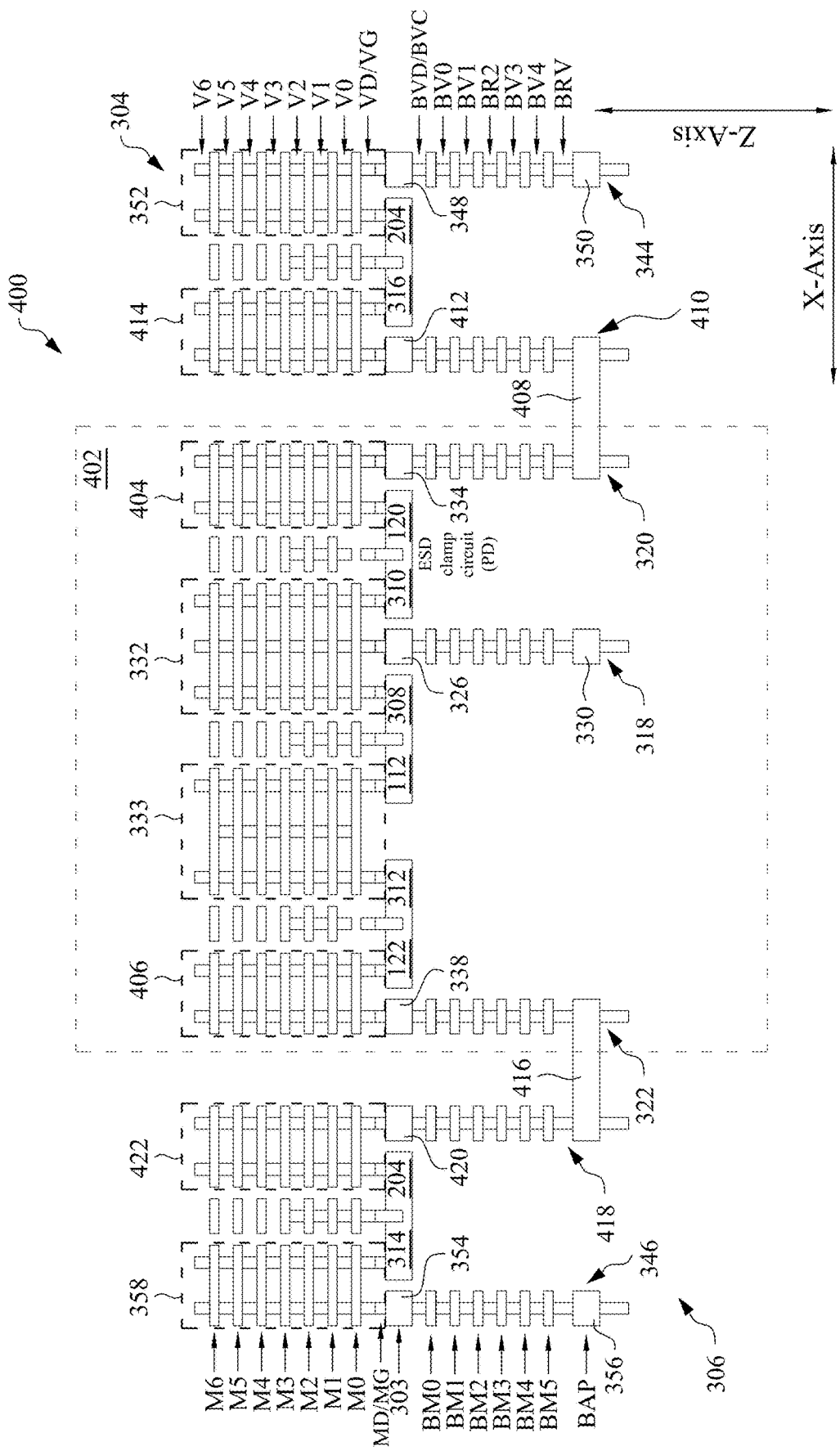
FIG. 4 is a cross sectional view of an IC device in accordance with some embodiments.

FIG. 4 is a cross sectional view of an IC device 400 in accordance with some embodiments.

The IC device 400 is similar to the IC device 300 described above with respect to FIG. 3. The IC device 400 includes an IC module 402 that is similar and has the same components as the IC module 302 described above except that the IC module 402 does not include the front side conductors and front side vias 337, and the front side conductors and front side vias 342. Instead, the IC module 402 includes front side conductors and front side vias 404 that connect the buried connection tower 320 to the protected circuit 120 in the semiconductor substrate segment 310 while front side conductors and front side vias 406 connect the buried connection tower 322 to the protected circuit 122 in the semiconductor substrate segment 338. Additionally, there are three additional metallization layers M4-M6 and four additional interconnection layers V3-V6.

Furthermore, in this embodiment, a conductor 408 is located at the bottom of the buried connection tower 320 (instead of the power pad 336) in the BAP layer. The conductor 408 is configured to connect the buried connection tower 320 to a buried connection tower 410. A bottom most portion of the buried connection tower 410 is provided by the conductor 408. The conductor 408 is configured to receive the reference voltage, VDD, which is the power source voltage.

The conductor 408 is connected to a conductor in the buried metallization layer BM5 by a via in the BRV layer. The buried connection tower 410 includes conductors in the buried metallization layer BM5-BM0 that are connected by vias in the buried interconnection layers BV4-BV0. A contact in the buried interconnection layer BVD/BVG connects a conductor in the buried metal layer BM0 to a semiconductor substrate segment 412. The semiconductor substrate segment 412 is at the top of the buried connection tower 410. Front side conductors and front side vias 414 connect the buried connection tower 410 to the PG ESD clamp circuit 204 on the right. In this manner, conductor 408 is a buried power rail for the reference voltage VDD. As in the embodiment discussed above in FIG. 3, the buried connection tower 344 and the front side conductors and front side vias 352 provide the reference voltage, VSS to the PD ESD clamp circuit 204 in the semiconductor substrate segment 316.

In this embodiment, a conductor 416 is located at the bottom of the buried connection tower 322 (instead of the power pad 340) in the BAP layer. The conductor 416 is configured to connect the buried connection tower 322 to a buried connection tower 418. A bottommost portion of the buried connection tower 418 is provided by the conductor 416. The conductor 416 is configured to receive the reference voltage, VSS, which is the ground voltage.

The conductor 416 is connected to a conductor in the buried metallization layer BM5 by a via in the BRV layer. The buried connection tower 416 includes conductors in the buried metallization layer BM5-BM0 that are connected by vias in the buried interconnection layers BV4-BV0. A contact in the buried interconnection layer BVD/BVG connects a conductor in the buried metal layer BM0 to a semiconductor substrate segment 420. The semiconductor substrate segment 420 is at the top of the buried connection tower 418. Front side conductors and front side vias 422 connect the buried connection tower 418 to the PG ESD clamp circuit 204 on the left. In this manner, conductor 416 is a buried power rail for the reference voltage VSS. As in the embodiment discussed above in FIG. 3, the buried connection tower 346 and the front side conductors and front side vias 358 provide the reference voltage, VDD to the PD ESD clamp circuit 204 in the semiconductor substrate segment 314.

Figure 5:
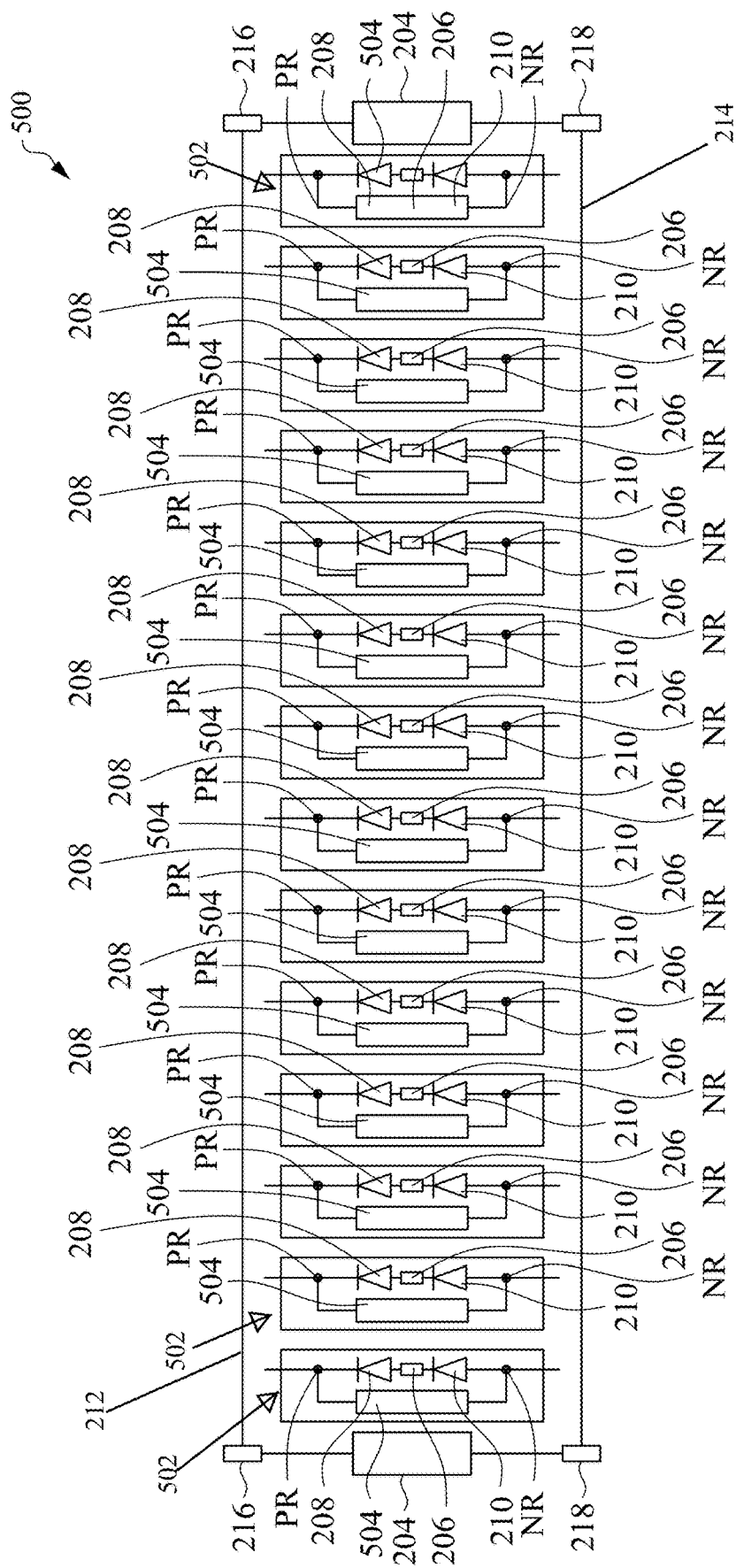
FIG. 5 is a circuit diagram of an IC device in accordance with one or more embodiments.

FIG. 5 is a circuit diagram of an IC device 500 in accordance with some embodiments.

The IC device 500 includes an array of IC modules 502 (not all labeled for the sake of clarity) and the same pair of ESD clamp circuits 204 at oppositely disposed ends of the array of IC modules 502 discussed with respect to FIG. 2. As with the embodiment described above with respect to FIG. 2, each of the PG ESD clamp circuits 204 are coupled between one of the power pads 216 and one of the power pads 218 at oppositely disposed ends of the array of IC modules 502. The first power supply rail 212 is coupled between the power pads 216 and the first ground reference rail 214 is coupled between the power pads 218, as described above with respect to FIG. 2. Each of the IC modules 502 includes an IO terminal 216, the PU ESD clamp circuit 208, and the PD ESD clamp circuit 210, described above with respect to FIG. 2. In some embodiments, one or more internal circuits (not shown) that each corresponds with the internal circuit 112 in FIG. 1 is connected to at least one of the IO terminals 216.

However, in this embodiment, each of the IC modules 502 further includes a PG ESD clamp circuit 504. Within each of the IC modules 502, the PG ESD clamp circuit 504 is connected between the first power supply rail 212 and the second power supply rail 216. In FIG. 5, a node PR is provided within each IC module 502 between the cathode of the diode in the PU ESD clamp circuit 208 the first power supply rail 212. Furthermore, a node NR is within each IC module 502 at the anode of the diode in the PD ESD clamp circuit 210 and the first ground reference rail 214. Within each IC module, the PG ESD clamp circuit is connected between node PR and node NR. In some embodiments, the IO terminal 216, the PU ESD clamp circuit 208, and the PD ESD clamp circuit 210 are connected in series wherein the PG ESD clamp circuit 504 is connected in parallel with the IO terminal 216, the PU ESD clamp circuit 208, and the PD ESD clamp circuit 210. In some embodiments, the PG ESD clamp circuit 504 corresponds to the PG ESD clamp circuit 124 in FIG. 1.

Figure 6:
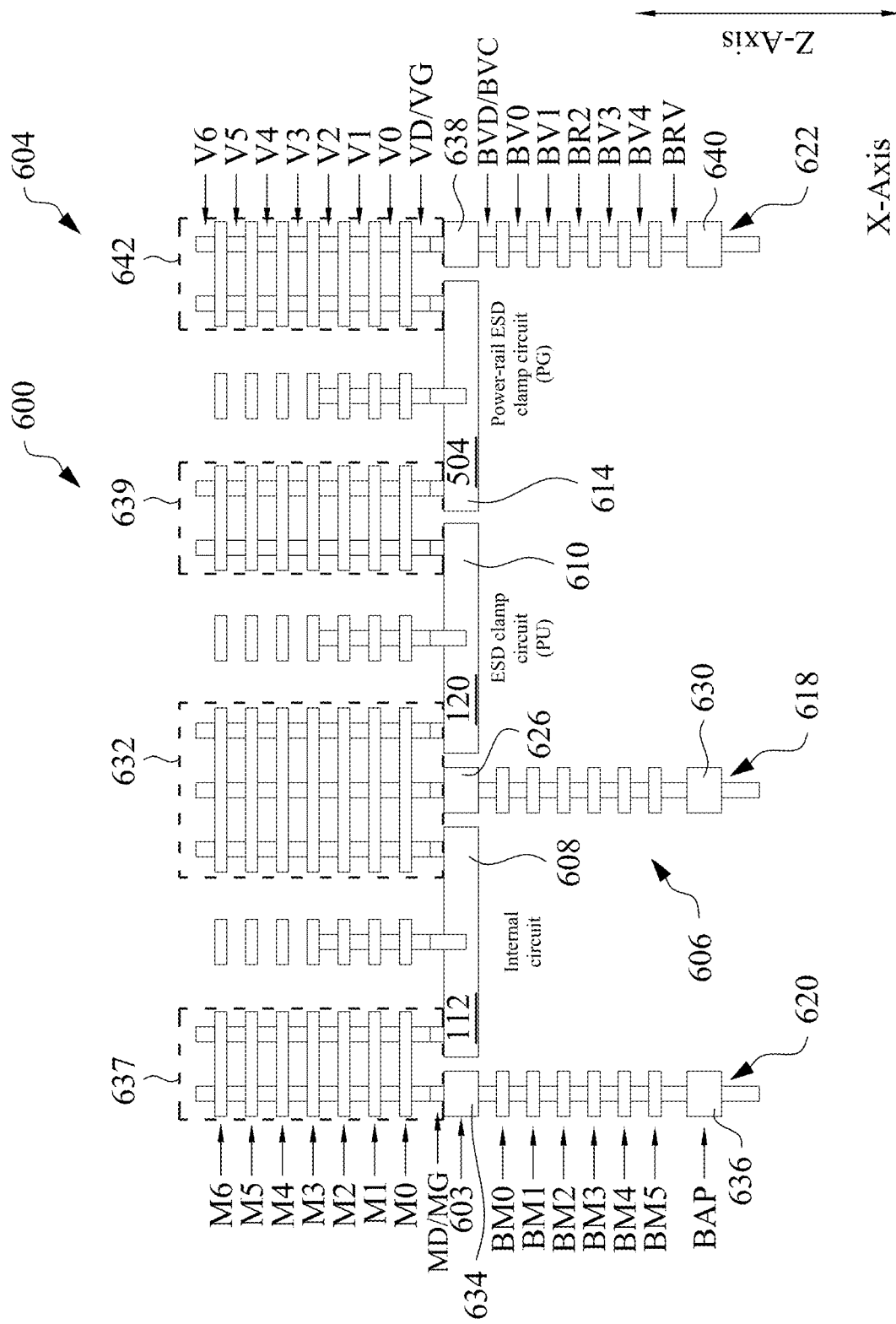
FIG. 6 is a cross sectional view of an IC module in accordance with some embodiments.

FIG. 6 is a cross sectional view of an IC module 600 in accordance with some embodiments.

The IC module 600 corresponds to the IC module 502 in FIG. 5. The cross sectional view is shown relative to the first direction that is parallel to the X-axis, which is a horizontal direction, and the third direction, which is parallel to the Z-axis, which is a vertical direction. A second direction, which is parallel to the Y-axis (not explicitly shown), extends into the page. The X-axis, the Y-axis, and the Z-axis are each orthogonal to one another.

The IC module 600 includes a semiconductor substrate 603 that extends in the first direction and in the second direction and has a thickness in the third direction. In a direction positive with respect to the Z-axis over the semiconductor substrate 603, the semiconductor substrate 603 has a front side 604. In a negative Z-axis beneath the semiconductor substrate 603, the semiconductor substrate 603 has a buried side 606. Routing and connections are provided at the front side 604 and at the buried side 606 of the semiconductor substrate 603.

On the front side 604 above semiconductor substrate, semiconductor device 602 further includes front side layers. The front side layers include: a contact-to-transistor-component layer (MD/MG layer); a via-between-contact-and-metallization layer (VD/VG layer); a first layer of metallization (M0 layer); a first layer of interconnection (V0 layer); a second layer of metallization (M1 layer); a second layer of interconnection (V1 layer); a third layer of metallization (M2 layer); a third layer of interconnection (V2 layer); a fourth layer of metallization (M3 layer); a fourth layer of interconnection (V3 layer); a fifth layer of metallization (M4 layer); a fifth layer of interconnection (V4 layer); a sixth layer of metallization (M5 layer); a sixth layer of interconnection (V5 layer); a sixth layer of metallization (M6 layer); and a seventh layer of interconnection (V6 layer). In some embodiments, additional metallization layers (not explicitly shown) and interconnection layers (not explicitly shown) are provided in the front side 604 while in other embodiments fewer metallization layers and fewer interconnection layers are provided in the front side 604.

Relative to the Z-axis, and below the semiconductor substrate 603 on the buried side, cross-section, semiconductor device 602 further includes buried layers. The buried layers include: a buried contact-to-transistor-component layer (BVD/BVG); a first buried layer of metallization (BM0 layer); a first buried layer of interconnection (BV0 layer); a second buried layer of metallization (BM1 layer); a second buried layer of interconnection (BV1 layer); a third buried layer of metallization (BM2 layer); a third buried layer of interconnection (BV2 layer); a fourth buried layer of metallization (BM3 layer); a fourth buried layer of interconnection (BV3 layer); a fifth buried layer of metallization (BM4 layer); a fifth buried layer of interconnection (BV4 layer); a sixth buried layer of metallization (BM5 layer); a buried redistribution layer (BRV layer); and a buried pad layer (BAP layer).

In this example, the semiconductor substrate 603 includes a semiconductor substrate segment 608. An internal circuit, such as the internal circuit 112 described above in FIG. 1, is formed in the semiconductor substrate segment 608. In some embodiments, the entire internal circuit 112 is provided in the semiconductor substrate segment 608. In other embodiments, the functional circuit 118 is provided in the semiconductor substrate segment 608 and the PMOS driver 114 and the NMOS driver 116 are provided in different semiconductor substrate segments. The input/output circuit 112 (not shown in FIG. 5) in FIG. 1 is connected to at least some IO terminals 216.

The semiconductor substrate 603 further includes a semiconductor substrate segment 610. The semiconductor substrate segment 610 includes the PU ESD clamp circuit 120 described above with respect to FIG. 1, which is in the module 602. A PD ESD clamp circuit is also provided in the IC module but is not shown in this embodiment.

The semiconductor substrate 603 further includes a semiconductor substrate segment 614. The semiconductor substrate segment 614 is the rightmost semiconductor substrate segment relative to the X-axis. The semiconductor substrate segment 614 includes the PG ESD clamp circuit 504, which corresponds to the PG ESD clamp circuit 124 in FIG. 1.

The IC module 600 includes buried connection towers 618, 620, 622. The buried connection tower 618 is between the semiconductor substrate segment 608 and the semiconductor substrate segment 610 relative to the X-axis. A topmost portion of the buried connection tower 618 is provided by a semiconductor substrate segment 626 (to the right of the semiconductor substrate segment 608 in the semiconductor substrate 603). The buried connection tower 618 includes a contact in the BVD/BVG layer that connects to a conductor in the buried metallization layer BM0. The buried connection tower 618 includes a conductor in each of the buried metallization layers BM0-BM5 that are connected by vias or via towers in buried interconnection layers BV0-BV4. Contacts in the buried BRV layer connect the conductor in the buried metallization layer BM5 to an input/output pad 630 in the BAP layer. The input/output pad 630 is at the bottommost portion of the buried connection tower 618 and is utilized to receive and transmit input/output signals. In some embodiments, the buried connection tower 618 corresponds to the resistor Rio, and the input/output pad 630 corresponds to the I/O terminal 106, as described with respect to FIG. 1.

To connect the buried connection tower 618 to the internal circuit 112 and to the PU ESD clamp circuit 120, front side conductors and front side metal vias (referred to collectively with element number 632) are on the front side 604 in metallization layers MD/MG, M0-M6, VD/VG, and interconnection layers V0-V6. Thus, front side conductors and front side metal vias 632 provide a connection from the buried connection tower 618 to both the internal circuit 112 in semiconductor substrate segment 608 and to the PU ESD clamp circuit 120 in semiconductor substrate segment 610. No other buried connection tower other than the buried connection tower 618 connects the input/output pad 630 to the internal circuit 112 in the semiconductor substrate segment 608 and to the PU ESD clamp circuit 120 in the semiconductor substrate segment 610. Accordingly, this significantly reduces the resistance between the input/output pad 630 and the PU ESD clamp circuit 120.

The buried connection tower 620 is to the left of the semiconductor substrate segment 608. A topmost portion of the buried connection tower 620 is provided by a semiconductor substrate segment 634. The buried connection tower 620 includes a contact in the BVD/BVG layer that connect to a conductor in the buried metallization layer BM0. The buried connection tower 620 includes conductors in each of the buried metallization layers BM0-BM5 that are connected by vias or via bars in buried interconnection layers BV0-BV4. A contact in the BRV layer connects the conductor in the buried metallization layer BM5 to a power pad 636 in the BAP layer. The power pad 636 is at the bottommost portion of the buried connection tower 620 and is utilized to receive a reference voltage VDD, which is a power source voltage. In some embodiments, the buried connection tower 620 corresponds to the resistor Rvdd, and the power pad 636 corresponds to the back-side power supply rail or pad 108, as described with respect to FIG. 1.

To connect the buried connection tower 620 to the internal circuit 112 on the right, front side conductors and front side metal vias (referred to collectively with element number 637) are on the front side 604 in metallization layers MD/MG, M0-M6, VD/VG, and interconnection layers V0-V6. Thus, front side conductors and front side metal vias 637 provide a connection from the buried connection tower 620 to the internal circuit 112 in semiconductor substrate segment 608. No other buried connection tower other than the buried connection tower 620 connects the power pad 636 to the internal circuit 112 in the semiconductor substrate segment 608. Accordingly, this significantly reduces the resistance between the power pad 636 and the internal circuit 112. Power pad 636 corresponds to power pad 108 in FIG. 1 and to one of the power pads 216 in FIG. 5.

To connect the buried connection tower 620 to the PG ESD clamp circuit 504, front side conductors and front side metal vias (referred to collectively with element number 639) are on the front side 604 in metallization layers MD/MG, M0-M6, VD/VG, and interconnection layers V0-V6. Thus, front side conductors and front side metal vias 639 provide a connection from the buried connection tower 620 to the PG ESD clamp circuit 504 in semiconductor substrate segment 614. No other buried connection tower other than the buried connection tower 620 connects the power pad 636 to the PG ESD clamp circuit 504 in the semiconductor substrate segment 614. Accordingly, this significantly reduces the resistance between the power pad 636 and the PG ESD clamp circuit 504 in the semiconductor substrate segment 614.

The buried connection tower 622 is to the right of the semiconductor substrate segment 614, which includes the PG ESD clamp circuit 504. A topmost portion of the buried connection tower 622 is provided by a semiconductor substrate segment 638. The buried connection tower 622 includes a contact in the BVD/BVG layer that connects to a conductor in the buried metallization layer BM0. The buried connection tower 622 includes conductors in each of the buried metallization layers BM0-BM5 that are connected by vias or via towers in buried interconnection layers BV0-BV4. A contact in the buried redistribution layer BRV layer connects the conductor in the buried metallization layer BM5 to a power pad 640 in the BAP layer. The power pad 640 is at the bottommost portion of the buried connection tower 622 and is utilized to receive a reference voltage VSS, which is a ground voltage. In some embodiments, the buried connection tower 622 corresponds to the resistor Rvss, and the power pad 640 corresponds to the back-side ground reference rail or pad 110, as described with respect to FIG. 1.

To connect the buried connection tower 622 to the PG ESD clamp circuit 504, front side conductors and front side metal vias (referred to collectively with element number 642) are on the front side 604 in metallization layers MD/MG, M0-M6, VD/VG, and interconnection layers V0-V6. Thus, front side conductors and front side metal vias 642 provide a connection from the buried connection tower 622 to the PG ESD clamp circuit 504 in semiconductor substrate segment 614. No other buried connection tower other than the buried connection tower 622 connects the power pad 640 to the PG ESD clamp circuit 504 in the semiconductor substrate segment 614. Accordingly, this significantly reduces the resistance between the power pad 640 and the PG ESD clamp circuit 504.

Figure 7:
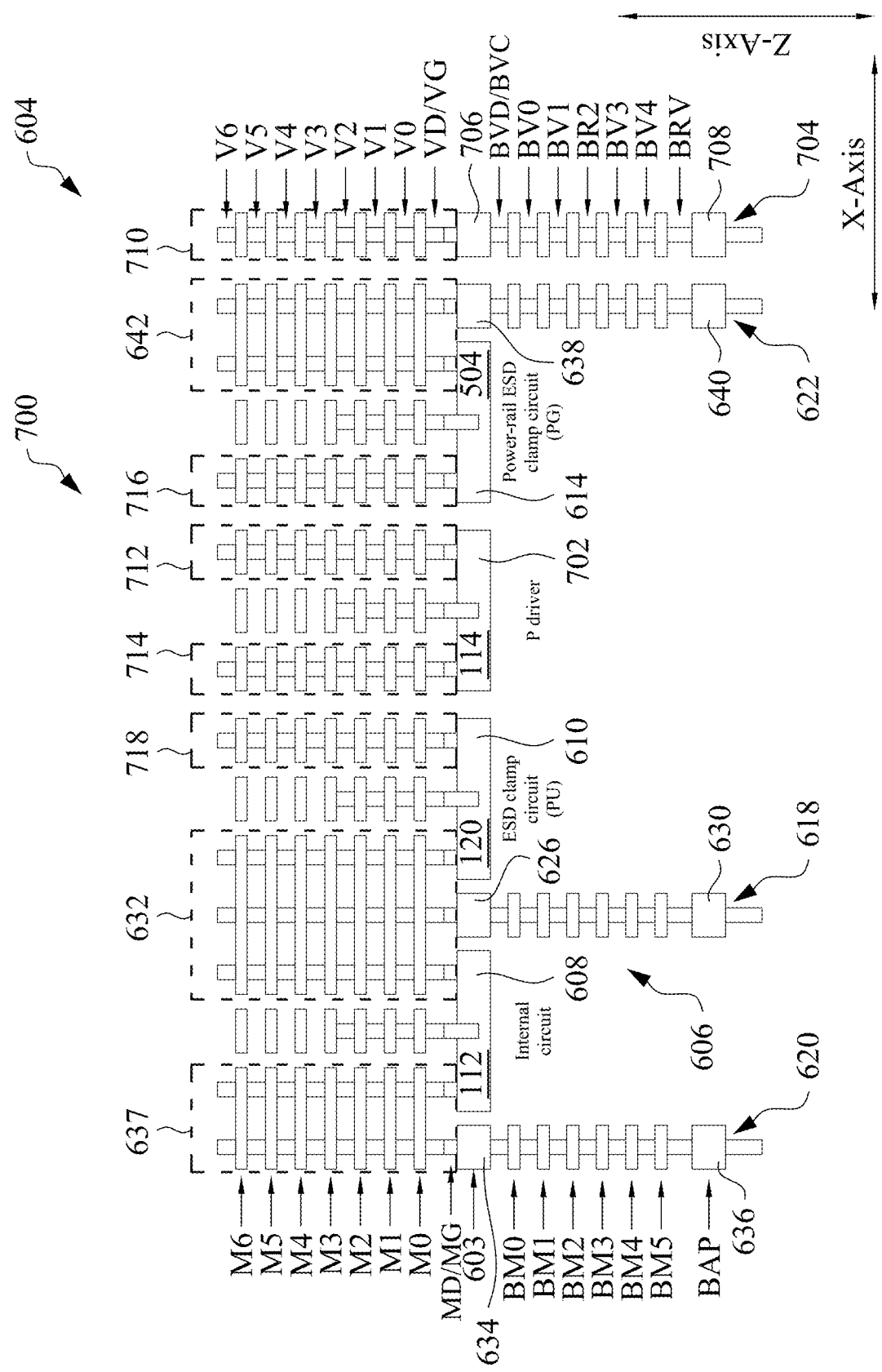
FIG. 7 is a cross sectional view of an IC module in accordance with some embodiments.

FIG. 7 is a cross sectional view of an IC module 700 in accordance with some embodiments.

The IC module 700 corresponds with any one of the IC modules 502 shown in FIG. 5. The IC module 700 is similar to the IC module 600 shown in FIG. 6 and thus this discussion will focus on the differences between the IC modules 600, 700 while discussion of the same components between the IC modules 600, 700 is omitted.

In this embodiment, a semiconductor substrate segment 702 is located between the semiconductor substrate segment 610 and the semiconductor substrate segment 614 relative to the X-axis. The PMOS driver 114 discussed above with respect to FIG. 1 is provided in the semiconductor substrate segment 614. A NMOS driver is provided in the IC module but is not expressly shown.

In addition, the IC module 700 includes a buried connection tower 704. The buried connection tower 704 is to the right of the buried connection tower 622. A topmost portion of the buried connection tower 704 is provided by a semiconductor substrate segment 706. The buried connection tower 704 includes a contact in the BVD/BVG layer that connects to a conductor in the buried metallization layer BM0. The buried connection tower 704 includes conductors in each of the buried metallization layers BM0-BM5 that are connected by vias or via bars in buried interconnection layers BV0-BV4. A contact in the buried redistribution layer BRV layer connects the conductor in the buried metallization layer BM5 to a power pad 708 in the BAP layer. The power pad 708 is at the bottommost portion of the buried connection tower 704 and is utilized to receive a reference voltage VDD, which is a power source voltage.

To connect the buried connection tower 704 to the PMOS driver 114, the PU ESD clamp circuit 120, and the PG ESD clamp circuit 504, front side conductors and front side metal vias (referred to collectively with element number 710) are on the front side 604 in metallization layers MD/MG, M0-M6, VD/VG, and interconnection layers V0-V6. Thus, front side conductors and front side metal vias 710 provide part of the connection from the buried connection tower 704 to the PMOS driver 114, the PU ESD clamp circuit 120, and the PG ESD clamp circuit 504.

To connect the buried connection tower 704 to the PMOS driver 114, front side conductors and front side metal vias (referred to collectively with element number 712) are on the front side 604 in metallization layers MD/MG, M0-M6, VD/VG, and interconnection layers V0-V6. Furthermore, front side conductors and front side metal vias (referred to collectively with element number 714) are on the front side 604 in metallization layers MD/MG, M0-M6, VD/VG, and interconnection layers V0-V6 to connect the PMOS driver 114 to the buried connection tower 618. In this manner, the PMOS driver 114 receives and transmits input/output signals from the buried connection tower 618 and receives the reference voltage VDD from the buried connection tower 704.

To connected the buried connection tower 704 to the PG ESD clamp circuit 504, front side conductors and front side metal vias (referred to collectively with element number 716) are provided on the front side 604 in metallization layers MD/MG, M0-M6, VD/VG, and interconnection layers V0-V6. In this manner, the PG ESD clamp circuit 504 receives the reference voltage VDD from the buried connection tower 704.

To connected the buried connection tower 704 to the PU ESD clamp circuit 120, front side conductors and front side metal vias (referred to collectively with element number 718) are provided on the front side 604 in metallization layers MD/MG, M0-M6, VD/VG, and interconnection layers V0-V6. In this manner, the PU ESD clamp circuit 120 receives the reference voltage VDD from the buried connection tower 704.

Figure 8:
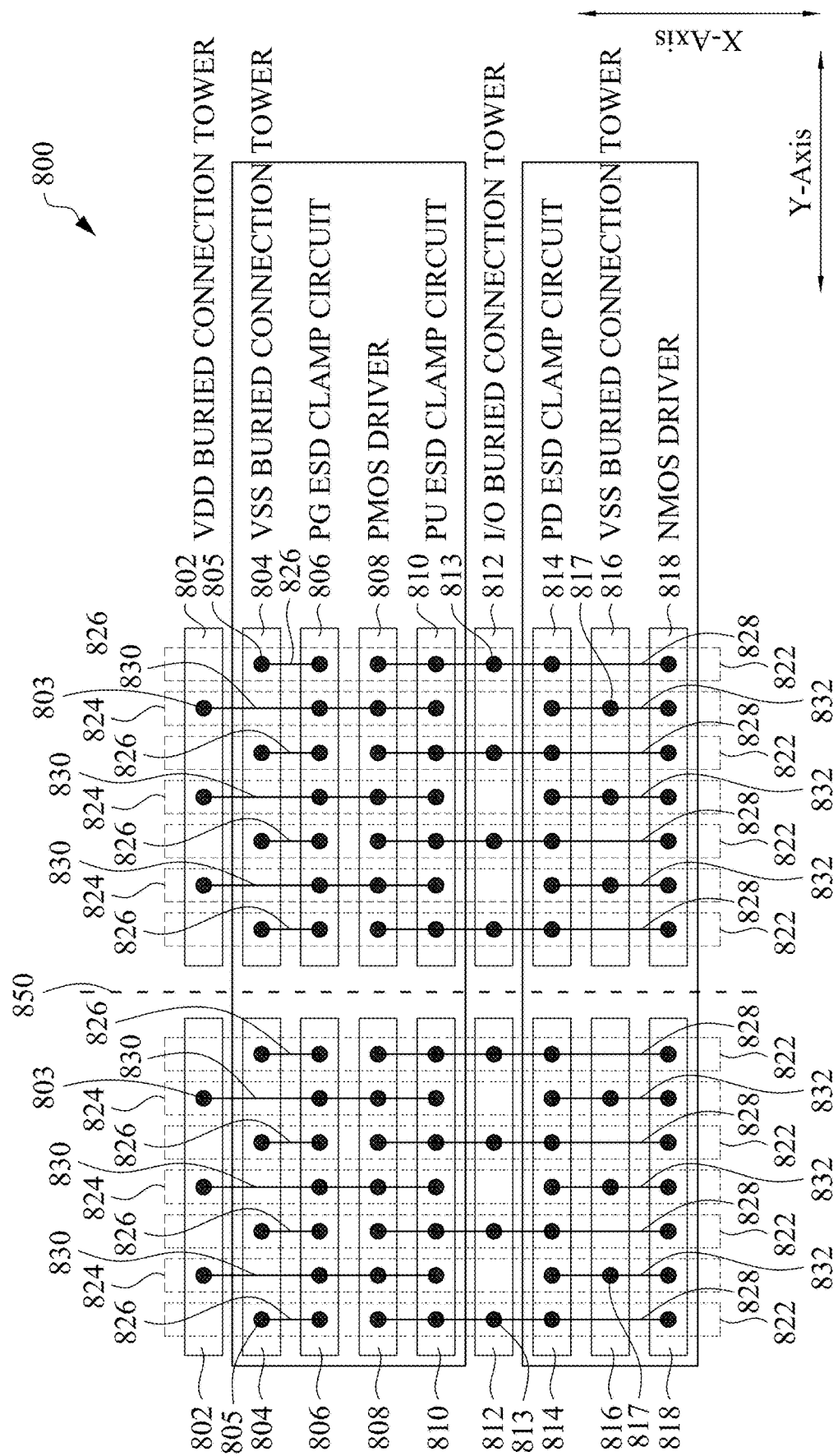
FIG. 8 is a block diagram of an IC device in accordance with some embodiments.

FIG. 8 is a block diagram of an IC device 800 in accordance with some embodiments. FIG. 8 schematically shows electrical connections on the front side of the IC device 800.

The block diagram is shown relative to an X-axis, and a Y-axis transverse to the X-axis. A third direction that is parallel with the Z-axis (not explicitly shown) extends into the page. The X-axis, the Y-axis, and the Z-axis are each orthogonal to one another. In some embodiments, the X-axis in FIG. 8 is the same as the X-axis in one or more of FIGS. 3, 4, 6, 7. In some embodiments, the X-axis in FIG. 8 is different from the X-axis in one or more of FIGS. 3, 4, 6, 7. In at least one embodiment, the X-axis in FIG. 8 is the same as the Y-axis in one or more of FIGS. 3, 4, 6, 7.

In the direction from up to down relative to the X-axis, the IC device 800 includes regions 802, 804, 806, 808, 810, 812, 814, 816, 818. Each of the regions 802, 804, 806, 808, 810, 812, 814, 816, 818, has a long axis that extends in a first direction parallel to the Y-axis. There are two of each of the regions 802, 804, 806, 808, 810, 812, 814, 816, 818 one on the left side and one on the right side of a line 850 relative to the Y-axis. In some embodiments, each of the regions 802, 804, 806, 808, 810, 812, 814, 816, 818 on the left side is symmetrical to the corresponding one of the regions 802, 804, 806, 808, 810, 812, 814, 816, 818 on the right side, across the line 850. The two regions 802 each include a buried connection tower 803 (corresponding to buried connection towers 320, 346 in FIGS. 3, 4 and buried connection towers 620 in FIGS. 6, 7 and buried connection tower 704 in FIG. 7) for receiving the reference voltage VDD. The two regions 804 each include a buried connection tower 805 (corresponding to buried connection tower 322, 344 in FIGS. 3, 4 and buried connection towers 622 in FIGS. 6, 7) for receiving the reference voltage VSS. The two regions 806 each include an array of PG ESD clamp circuits (each corresponding to PG ESD clamp circuit 124 in FIG. 1, PG ESD clamp circuit 204 in FIGS. 2-5, PG ESD clamp circuit 504 in FIGS. 5-7). The two regions 808 each include an array of PMOS drivers (each corresponding to PMOS driver 114 in FIGS. 1, 5). The two regions 810 each include an array of PU ESD clamp circuits (each corresponding to PU ESD clamp circuit 120 in FIGS. 1, 3-4, 6-7 and PU ESD clamp circuit 208 in FIGS. 2, 5). The two regions 812 each include a buried connection tower 813 (corresponding to buried connection tower 318 in FIG. 3 and FIG. 4, buried connection tower 618 in FIG. 6 and FIG. 7) for receiving and transmitting input/output signals. The two regions 814 each include an array of PD ESD clamp circuits (each corresponding to PD clamp circuit 122 in FIGS. 1, 3-4, 6-7 and PD clamp circuit 210 in FIGS. 2, 5). The two regions 816 each include a buried connection tower 817 (corresponding to buried connection tower 322, 344 in FIGS. 3, 4 and buried connection towers 622 in FIGS. 6, 7) for receiving the reference voltage VSS. The two regions 818 each include an array of NMOS drivers (each corresponding to NMOS driver 116 in FIG. 1).

The IC device 800 further includes routing regions 822, 824, that are interleaved with each other. Routing regions 822, 824, each have a long axis that extends in a second direction that is parallel to the X-axis and that overlap the regions 802, 804, 806, 808, 810, 812, 814, 816, 818. Relative to the Y-axis, the regions are ordered 822, 824 in a repeating pattern. Each of regions 822 includes conductors and vias (referred to collectively with element number 826). The conductors and vias 826 connect a PG ESD clamp circuit in region 806 to the corresponding buried connection tower 805 in region 804. Each of regions 822 includes conductors and vias (referred to collectively with element number 828). The conductors and vias 828 connect a PMOS driver in region 808, a PU ESD clamp circuit in region 810, a PD ESD clamp circuit in region 814 and an NMOS driver in region 818 to the corresponding buried connection tower 813 in region 812.

Each of regions 824 includes conductors and vias (referred to collectively with element number 830). The conductors and vias 830 connect a PG ESD clamp circuit in region 806, a PMOS driver in region 808, and a PU ESD clamp circuit in region 810 to the corresponding buried connection tower 803 in region 802. Each of regions 824 includes conductors and vias (referred to collectively with element number 832). The conductors and vias 832 connect a PD ESD clamp circuit in region 814 and an NMOS driver in region 818 to the corresponding buried connection tower 817 in region 816. Furthermore, By interleaving the regions 822, 824, the shortest interconnect paths are provided on the front side to reduce the resistance of the ESD conduction paths. In at least one embodiment, one region 222 and one region 224 together correspond on one IC module 502 in FIG. 5. In FIG. 8, one I/O buried connection tower 813 is sufficient for one IC module.

Figure 9:
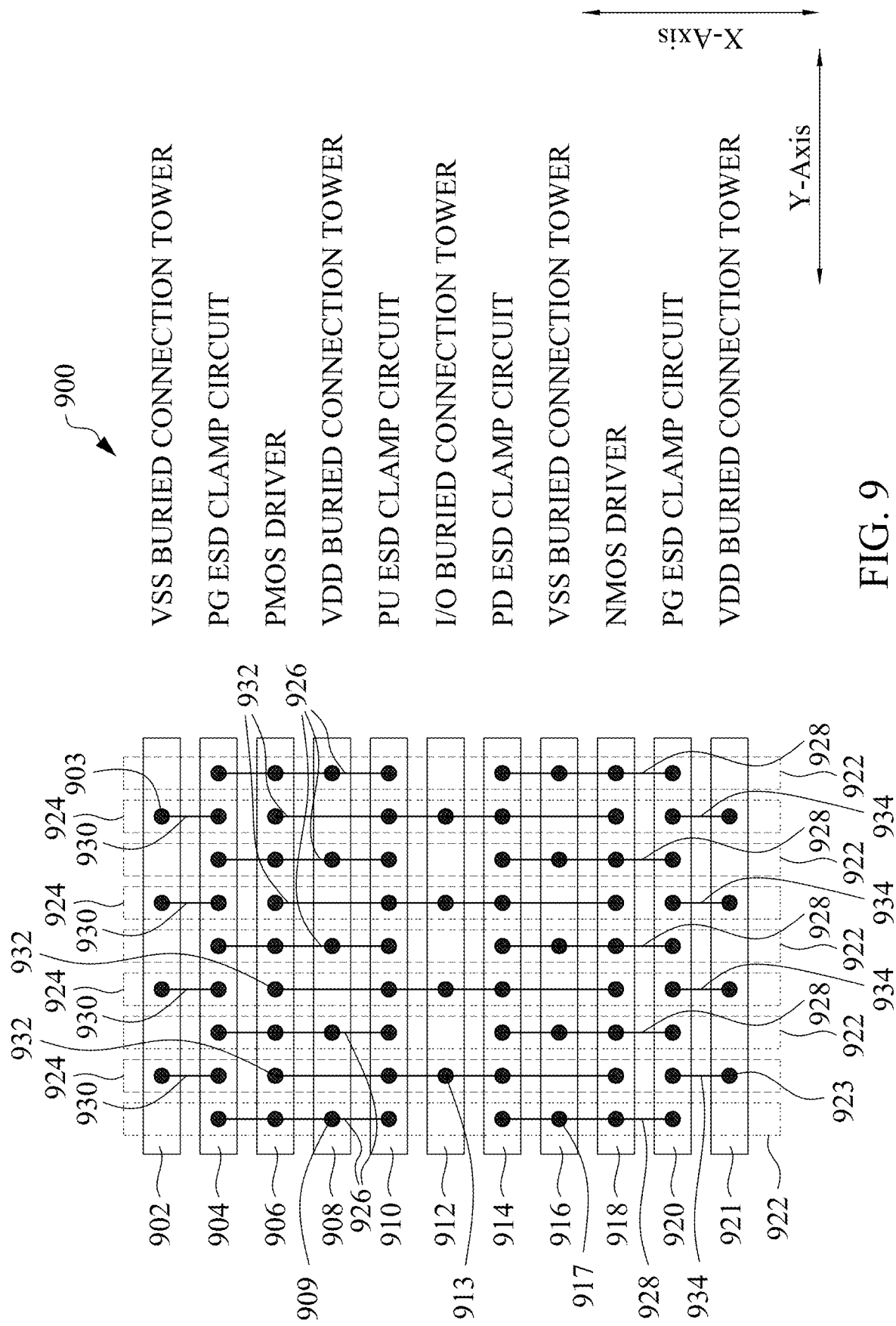
FIG. 9 is a block diagram of an IC device in accordance with some embodiments.

FIG. 9 is a block diagram of an IC device 900 in accordance with some embodiments.

The block diagram is shown relative to the first direction that is parallel to the X-axis, which is a vertical direction, and the second direction that is parallel to the Y-axis, which is a horizontal direction. A third direction that is parallel to the Z-axis (not explicitly shown) extends into the page. The X-axis, the Y-axis, and the Z-axis are each orthogonal to one another.

In the direction from up to down relative to the X-axis, the IC device 900 includes regions 902, 904, 906, 908, 910, 912, 914, 916, 918, 920, 921. Each of the regions 902, 904, 906, 908, 910, 912, 914, 916, 918, 920, 921 has a long axis that extends in a first direction parallel to the Y-axis. The region 902 includes a buried connection tower 903 (corresponding to buried connection tower 322, 344 in FIGS. 3, 4 and buried connection towers 622 in FIGS. 6, 7) for receiving the reference voltage VSS. The region 904 includes an array of PG ESD clamp circuits (each corresponding to PG ESD clamp circuit 124 in FIG. 1, PG ESD clamp circuit 204 in FIGS. 2-5, PG ESD clamp circuit 504 in FIGS. 5-7). The region 906 includes an array of PMOS drivers (each corresponding to PMOS driver 114 in FIGS. 1, 5). The region 908 includes a buried connection tower 909 (corresponding to buried connection towers 320, 346 in FIGS. 3, 4 and buried connection towers 620 in FIGS. 6, 7 and buried connection tower 708 in FIG. 7) for receiving the reference voltage VDD. The region 910 includes an array of PU ESD clamp circuit (each corresponding to PU ESD clamp circuit 120 in FIGS. 1, 3-4, 6-7 and PU ESD clamp circuit 208 in FIGS. 2, 5). The regions 912 includes a buried connection tower 913 (corresponding to buried connection tower 318 in FIG. 3 and FIG. 4, buried connection tower 618 in FIG. 6 and FIG. 7) for receiving and transmitting input/output signals. The region 914 includes an array of PD ESD clamp circuits (each corresponding to PD clamp circuit 122 in FIGS. 1, 3-4, 6-7 and PD clamp circuit 210 in FIGS. 2, 5). The region 916 includes a buried connection tower 917 (corresponding to buried connection tower 322, 344 in FIGS. 3, 4 and buried connection towers 622 in FIGS. 6, 7) for receiving the reference voltage VSS. The region 918 includes an array of NMOS drivers (each corresponding to NMOS driver 116 in FIG. 1). The region 920 includes an array of PG ESD clamp circuits (each corresponding to PG ESD clamp circuit 124 in FIG. 1, PG ESD clamp circuit 204 in FIGS. 2-5, PG ESD clamp circuit 504 in FIGS. 5-7). The region 921 includes a buried connection tower 923 (corresponding to buried connection towers 320, 346 in FIGS. 3, 4 and buried connection towers 620 in FIGS. 6, 7 and buried connection tower 708 in FIG. 7) for receiving the reference voltage VDD.

The IC device 900 further includes routing regions 922, 924, that are interleaved with each other. Routing regions 922, 924, each have a long axis that extends in a second direction that is parallel to the X-axis and that overlap the regions 902, 904, 906, 908, 910, 912, 914, 916, 918, 920, 921. Relative to the X-axis, the regions are ordered 922, 924 in a repeating pattern. Each of regions 922 include conductors and vias (referred to collectively with element number 926). Each of the conductors and vias 926 connect a PG ESD clamp circuit in region 904, a PMOS driver in region 906, and a PU ESD clamp circuit in region 910 to the connection tower in region 908. Furthermore, each regions 922 include conductors and vias (referred to collectively with element number 928). Each of the conductors and vias 928 connect a PD ESD clamp circuit in region 914, an NMOS driver in region 918, and a PG ESD clamp circuit in region 920 to the connection tower in region 916.

Each of regions 924 include conductors and vias (referred to collectively with element number 930). Each of the conductors and vias 930 connect PG ESD clamp circuit in region 904 to the connection tower in region 902. Each of regions 924 include conductors and vias (referred to collectively with element number 932). Each of the conductors and vias 932 connect a PMOS driver in region 906, a PU ESD clamp circuit in region 910, a PD ESD clamp circuit in region 914, and an NMOS driver in region 918 to the connection tower in region 912. Furthermore, each regions 924 include conductors and vias (referred to collectively with element number 934). Each of the conductors and vias 934 connect a PG ESD clamp circuit in region 914 to the connection tower in region 921. By interleaving the regions 922, 924, the shortest interconnect paths are provided on the front side to reduce the resistance of the ESD conduction paths. In at least one embodiment, one region 922 and one region 924 together correspond on one IC module 502 in FIG. 5. It can be seen in FIG. 9 that one I/O buried connection tower 913 is sufficient for one IC module.

Figure 10:
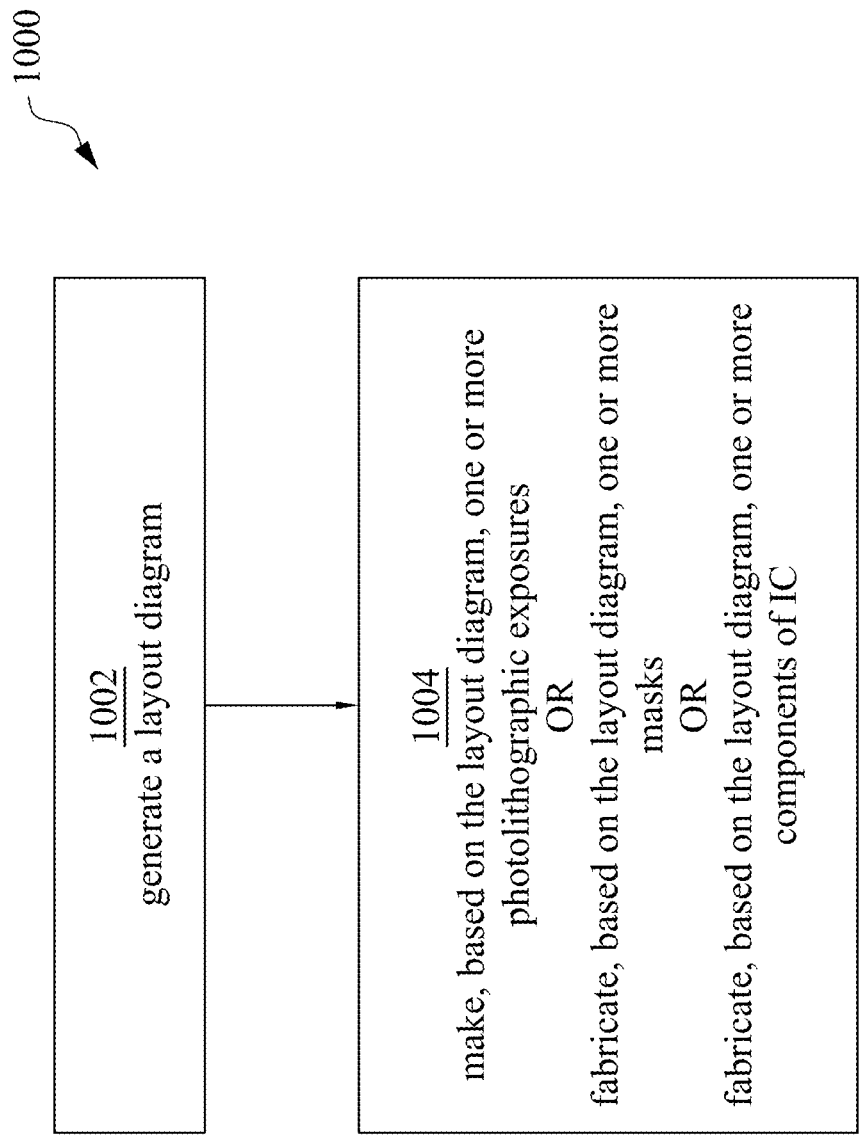
FIG. 10 is a flowchart of a method of generating a layout diagram, in accordance with some embodiments.

FIG. 10 is a flowchart of a method 1000 of generating a layout diagram, in accordance with some embodiments.

Method 1000 is implementable, for example, using EDA system 1000 (FIG. 13, discussed below) and an integrated circuit (IC) manufacturing system 1400 (FIG. 14, discussed below), in accordance with some embodiments. Regarding method 1000, examples of the layout diagram include the layout diagrams disclosed herein, or the like. Examples of a semiconductor device which can be manufactured according to method 1000 include IC device 100 in FIG. 1, IC device 200 in FIG. 2, IC device 300 in FIG. 3, IC device 400 in FIG. 4, IC device 500 in FIG. 5, IC module 600 in FIG. 6, IC module 700 in FIG. 7, IC device 800 in FIG. 8, and IC device 900 in FIG. 9.

In FIG. 10, method 1000 includes blocks 1002-1004. At block 1002, a layout diagram is generated which, among other things, include patterns represent one or more circuit regions as disclosed above in FIGS. 1-9, or the like. An example of a semiconductor device corresponding to a layout diagram generated by block 1002 includes IC device 100 in FIG. 1, IC device 200 in FIG. 2, IC device 300 in FIG. 3, IC device 400 in FIG. 4, IC device 500 in FIG. 5, IC module 600 in FIG. 6, IC module 700 in FIG. 7, IC device 800 in FIG. 8, and IC device 900 in FIG. 9. Block 1002 is discussed in more detail below with respect to FIG. 11A-11D. From block 1002, flow proceeds to block 1004.

At block 1004, based on the layout diagram, at least one of (A) one or more photolithographic exposures are made or (B) one or more semiconductor masks are fabricated or (C) one or more components in a layer of a semiconductor device are fabricated. See discussion below of FIG. 12A-12D.

Figure 11A:
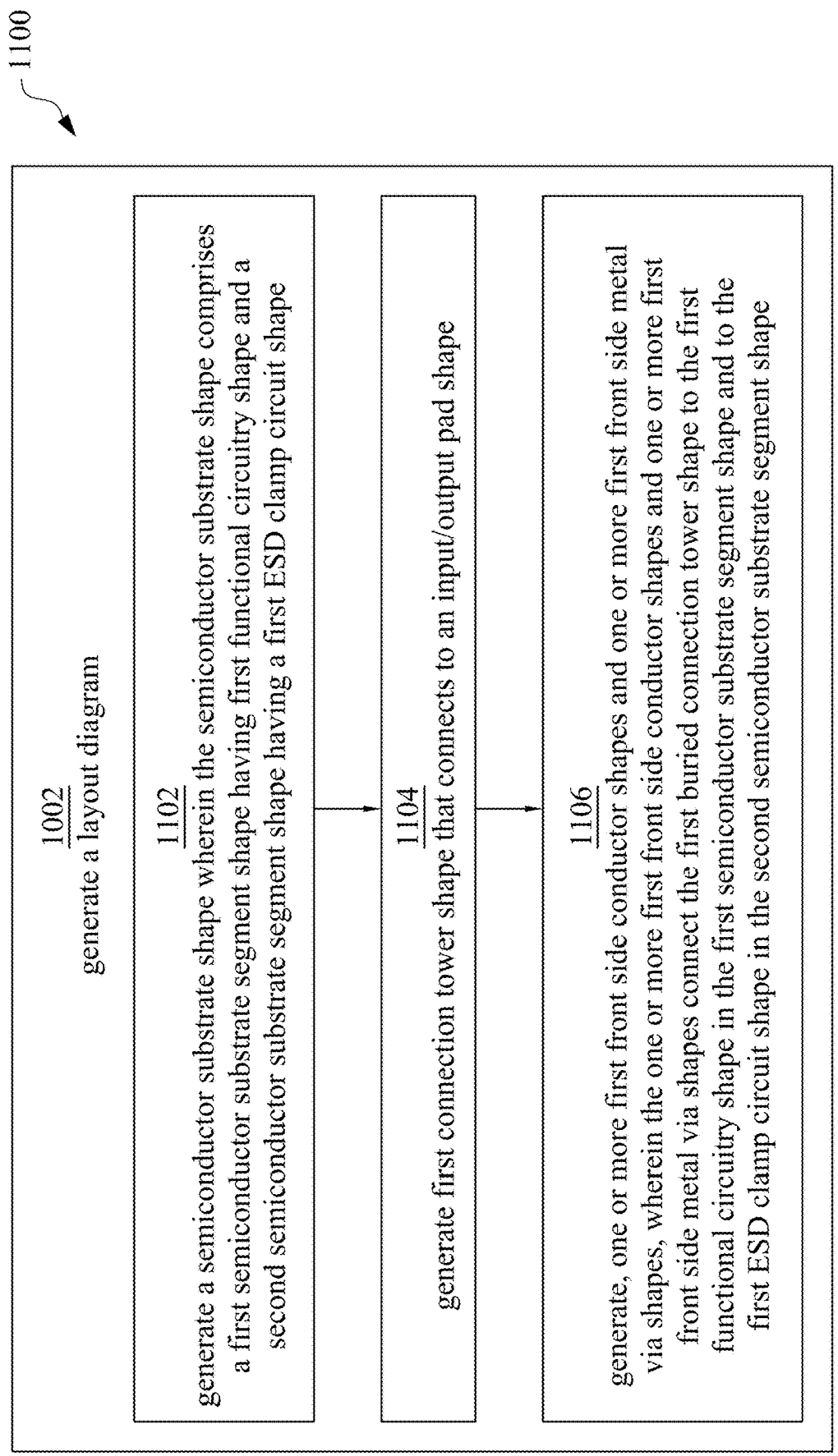
FIG. 11A is a flowchart of a method of generating a layout diagram, in accordance with some embodiments.

FIG. 11A is a flowchart of a method 1100 of generating a layout diagram, in accordance with some embodiments. It should be noted that FIG. 11A-11D relates to a layout diagram, the layout diagram includes "shape(s)" that represent the features of an actual physical semiconductor device. The correspondence between the shapes in the diagram representing the actual features in the semiconductor device are described below in the discussion related to FIG. 11A-11D.

FIG. 11A shows additional blocks that demonstrate one example of procedures that may be implemented in block 1002 of FIG. 10, in accordance with one or more embodiments.

In FIG. 11A, block 1002 includes blocks 1102-1106. At block 1102, a semiconductor substrate shape is generated wherein the semiconductor substrate shape comprises a first semiconductor substrate segment shape having first functional circuitry shape and a second semiconductor substrate segment shape having a first ESD clamp circuit shape. The semiconductor substrate shape is the portion (i.e., the drawn shape) of the layout diagram that represents the semiconductor substrate that is formed in an actual physical circuit. Similarly, the functional circuitry shape is the portion (i.e., the drawn shape) of the layout diagram that represents the functional circuitry. In some embodiments, the functional circuitry shape includes source/drain shapes that represent source/drains, poly/gate shapes to represent the gates, doped region shapes, and/or the like to represent portions in a semiconductor substrate of active semiconductor components that are part of the functional circuitry. In some embodiments, the functional circuitry shape includes connection routing shapes on the front side and/or the back side to connect the shapes in the layout diagram that represent portions in a semiconductor substrate of active semiconductor components. In some embodiments, first semiconductor substrate shape corresponds to shapes in a layout diagram that represent semiconductor substrate 303 in FIGS. 3, 4 and semiconductor substrate 603 in FIGS. 6, 7. In some embodiments, first semiconductor substrate segment shape corresponds to shapes in a layout diagram that represent semiconductor substrate segment 308 in FIGS. 3, 4 and semiconductor substrate segment 608 in FIGS. 6, 7. In some embodiments, first functional circuitry shape correspond to shapes in a layout diagram that represent functional circuitry 112 in FIGS. 3, 4 and FIGS. 6, 7. In some embodiments, second semiconductor substrate segment shape correspond to shapes in a layout diagram that represent semiconductor substrate segments 310, 312 in FIGS. 3, 4 and semiconductor substrate segment 610 FIGS. 6, 7. In some embodiments, ESD clamp circuit shape corresponds to shapes in a layout diagram that represent ESD clamp circuits 120, 122 in FIGS. 3, 4 and FIGS. 6, 7.

At block 1104, first connection tower shape is generated that connects to an input/output pad shape. In some embodiments, first connection tower shape corresponds to shapes representing buried connection tower 318 in FIGS. 3, 4 and buried connection tower 618 in FIGS. 6, 7.

At block 1106, one or more first front side conductor shapes and one or more first front side metal via shapes are generated wherein the one or more first front side conductor shapes and one or more first front side metal via shapes connect the first buried connection tower shape to the first functional circuitry shape in the first semiconductor substrate segment shape and to the first ESD clamp circuit shape in the second semiconductor substrate segment shape. In some embodiments, the one or more first front side conductor shapes and one or more first front side metal via shapes correspond to shapes in a layout diagram that represent front side conductors and front side vias 332, 333 in FIGS. 3, 4 and front side conductors and front side vias 632 in FIGS. 6, 7.

Figure 11B:
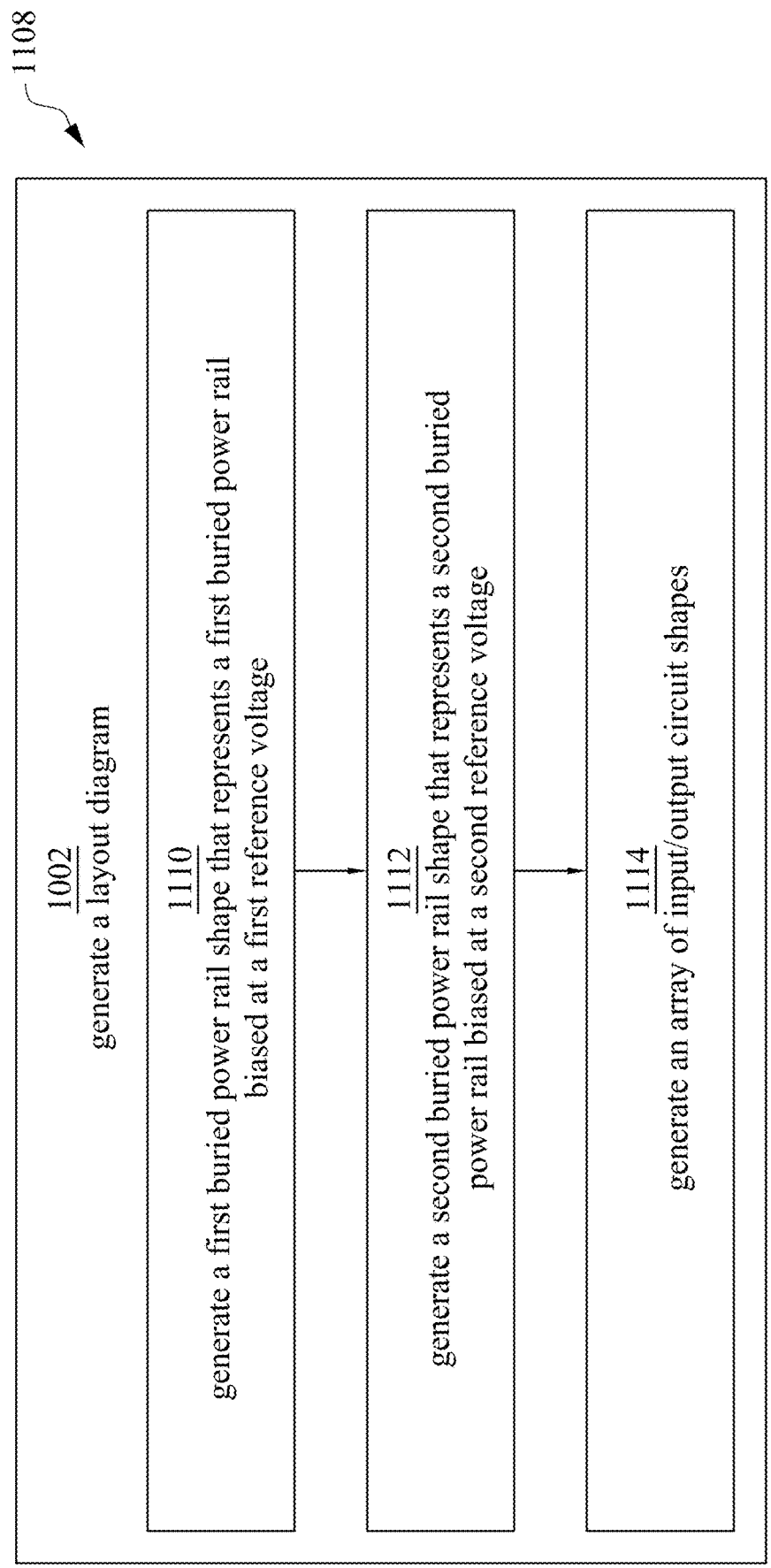
FIG. 11B is a flowchart of a method of generating a layout diagram, in accordance with some embodiments.

FIG. 11B is a flowchart of a method 1108 of generating a layout diagram, in accordance with some embodiments.

More particularly, the flowchart of FIG. 11B shows additional blocks that demonstrates one example of procedures that may be implemented in block 1002 of FIG. 10, in accordance with one or more embodiments.

In FIG. 11B, block 1002 includes blocks 1110-1114. At block 1110, a first buried power rail shape that represents a first buried power rail biased at a first reference voltage is generated. In some embodiments, first buried power rail shape corresponds to shapes in a layout diagram that represent the buried power rail 212 that is biased at the reference voltage VDD in FIG. 5.

At block 1112, a second buried power rail shape that represents a second buried power rail biased at a second reference voltage is generated. In some embodiments, second buried power rail shape corresponds to shapes in a layout diagram that represent the buried power rail 214 that is biased at the reference voltage VSS in FIG. 5.

At block 1114, an array of input/output circuit shapes is generated. Each of the input output circuit shapes includes an input/output terminal shape of an internal functional circuit shape, a first ESD clamp circuit shape connected between the input/output terminal shape and the first power rail, a second ESD clamp circuit shape connected between the input/output terminal shape and the second power rail shape, and a third ESD clamp circuit shape connected at a first end to a first node between the first buried power rail shape and the first ESD clamp circuit shape, and at a second end to a second node between the second buried power rail shape and the second ESD clamp circuit shape. In some embodiments, the first buried power rail shape corresponds to shapes that represent buried power rail 212 in FIG. 5. In some embodiments, the second buried power rail shape corresponds to shapes that represent buried power rail 214 in FIG. 5. In some embodiments, array of input/output circuit shapes corresponds to shapes that represent the array of IC modules 502 in FIG. 5. In some embodiments, first ESD clamp circuit shape corresponds to shapes that represent PU ESD clamp circuit 208 in FIG. 5. In some embodiments, second ESD clamp circuit shape corresponds to shapes that represent PD ESD clamp circuit 210 in FIG. 5. In some embodiments, third ESD clamp circuit shape corresponds to shapes that represent PG ESD clamp circuit 504 in FIG. 5.

Figure 11C:
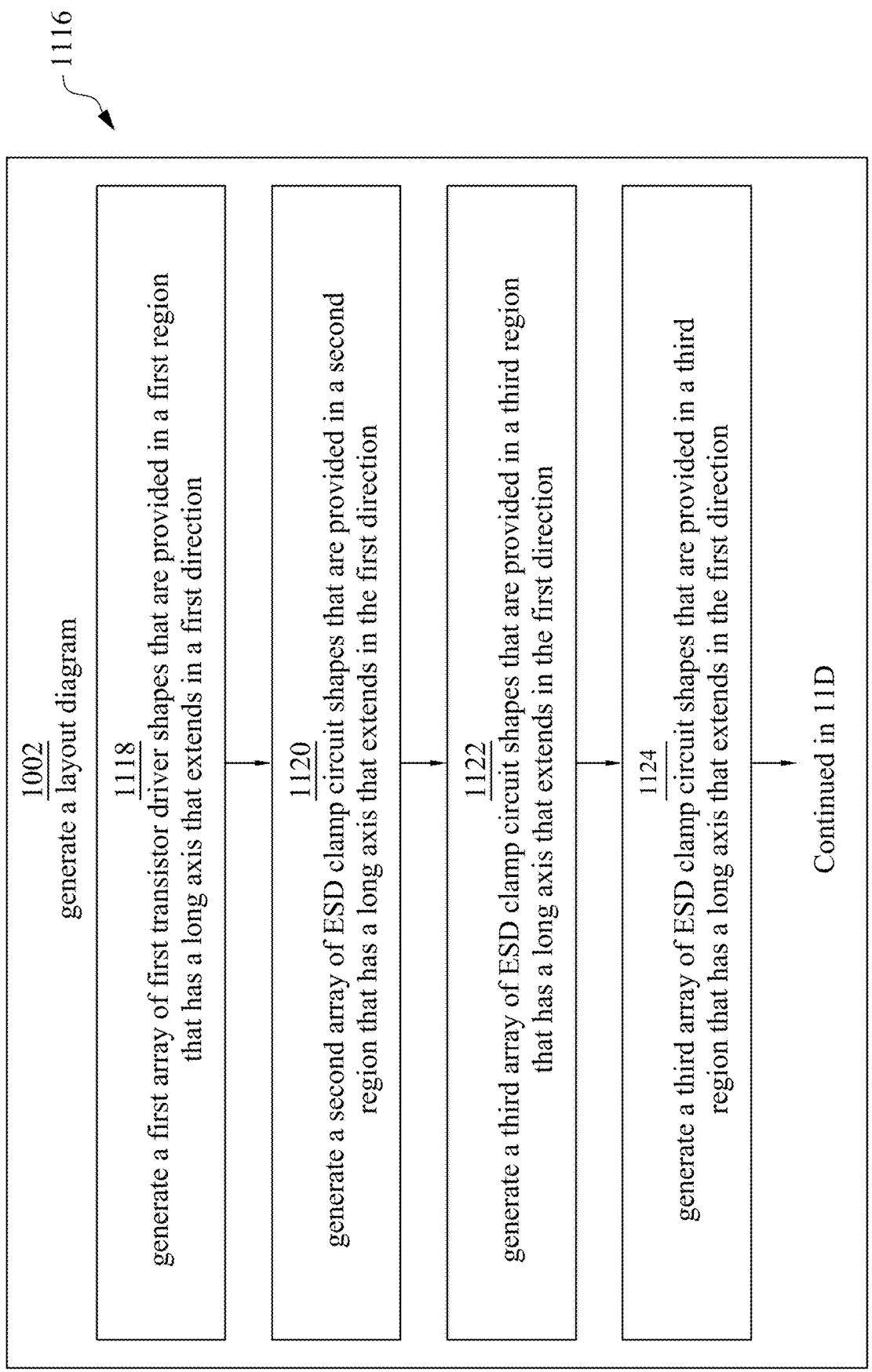

FIGS. 11C-11D are a flowchart of a method 1116 of generating a layout diagram, in accordance with some embodiments.

More particularly, the flowchart of FIGS. 11C-11D show additional blocks that demonstrates one example of procedures that may be implemented in block 1002 of FIG. 10, in accordance with one or more embodiments.

In FIGS. 11C-11D, block 1002 includes blocks 1118-1130. At block 1118, a first array of first transistor driver shapes is generated that are provided in a first region that has a long axis that extends in a first direction. In some embodiments, first array of first transistor driver shapes that are provided in a first region corresponds to the array of transistor drivers in region 808 in FIG. 8 and in region 906 in FIG. 9.

At block 1120, a second array of ESD clamp circuit shapes is generated that are provided in a second region that has a long axis that extends in the first direction. In some embodiments, second array of ESD clamp circuit shapes that are provided in a second region corresponds to shapes in a layout diagram that represent the array of ESD clamp circuits in region 804 in FIG. 8 and in region 910 in FIG. 9.

At block 1122, a third array of ESD clamp circuit shapes is generated that are provided in a third region that has a long axis that extends in the first direction. In some embodiments, third array of ESD clamp circuit shapes are provided in a third region corresponds to shapes in a layout diagram that represent the array of ESD clamp circuits in region 818 in FIG. 8 and in region 910 in FIG. 9.

At block 1124, a first connection tower shape is generated in a fourth region that has a long axis that extends in the first direction, wherein the first connection tower shape is configured to transmit input/output signals. In some embodiments, a first connection tower shape in a fourth region corresponds to shapes in a layout diagram that represent the connection tower in region 802 in FIG. 8 and in region 912 in FIG. 9.

At block 1126, a second connection tower shape is generated in a fifth region that has a long axis that extends in the first direction, the second connection tower shape configured to be biased at a first reference voltage. In some embodiments, a second connection tower shape in a fifth region corresponds to shapes in a layout diagram that represent the connection tower in region 810 in FIG. 8 and in region 916 in FIG. 9.

At block 1128, one or more first conductor shapes and one or more first via shapes are generated in a sixth region that has a long axis extends in a second direction that is transverse to the first direction, wherein the one or more first conductor shapes and the one or more first via shapes connect a first one of the first transistor driver shapes in the first array and a first one of the ESD clamp circuit shapes in the second array to the first connection tower shape. In some embodiments, one or more first conductor shapes and one or more first via shapes in a sixth region corresponds to shapes in a layout diagram that represent the conductor shapes and via shapes 826 in region 822 in FIG. 8 and conductor shapes and via shapes 932 in region 924 in FIG. 9.

At block 1130, one or more second conductor shapes and one or more second via shapes are generated in a sixth region that has a long axis extends in a second direction that is transverse to the first direction, wherein the one or more second conductors and the one or more second vias connect a first one of the ESD clamp circuits in the third array to the second connection tower. In some embodiments, one or more second conductor shapes and one or more second via shapes in a sixth region corresponds to shapes in a layout diagram that represent the conductor shapes and via shapes 832 in region 824 in FIG. 8 and conductor shapes and via shapes 928 in region 922 in FIG. 9.

Figure 12A:
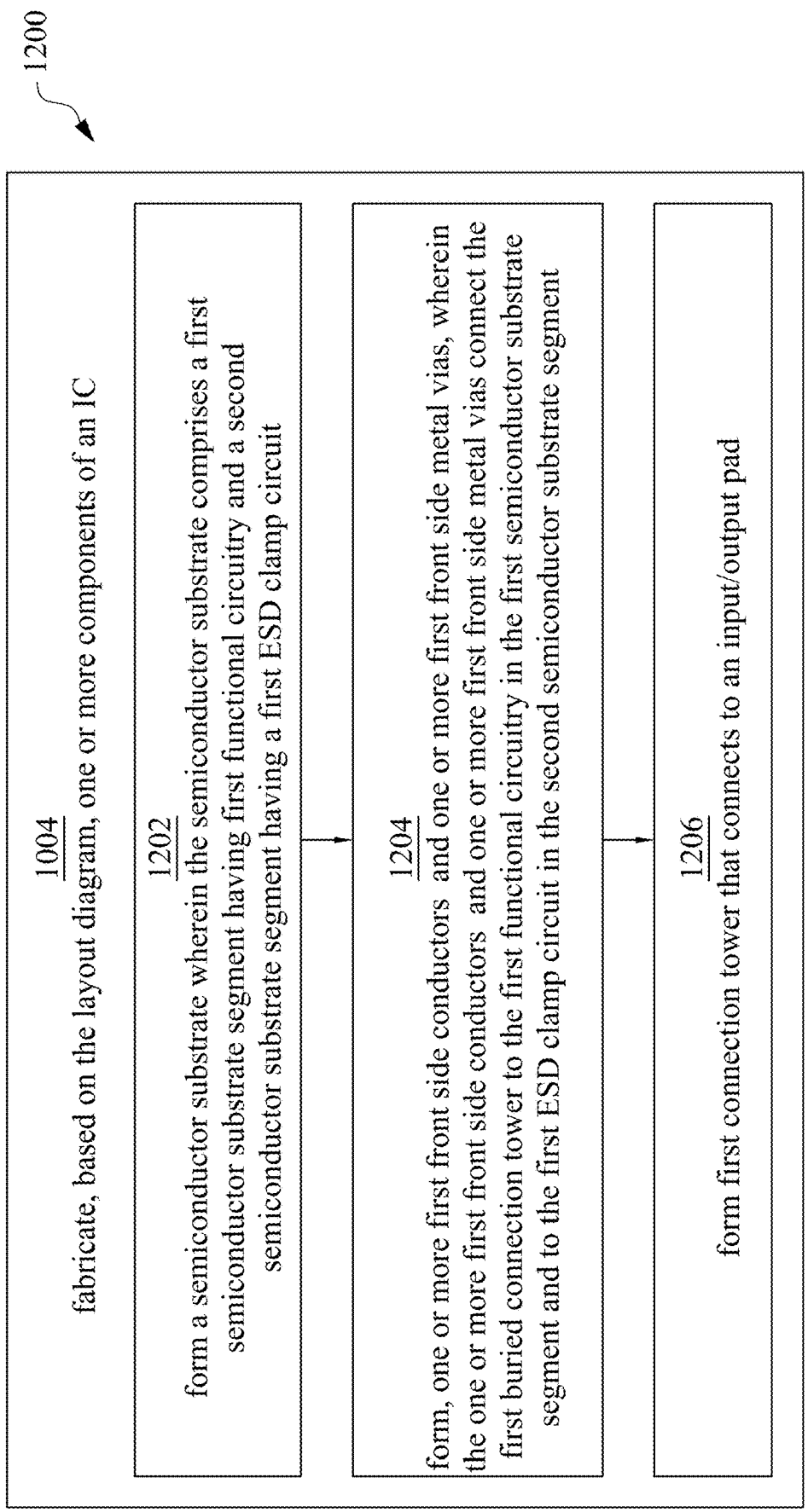
FIG. 12A is a flowchart of a method of fabrication, based on the layout diagram, of at least one component of an IC, in accordance with some embodiments.

FIG. 12A is a flowchart of a method 1200 of fabricate, based on the layout diagram, at least one component of an IC, in accordance with some embodiments.

More particularly, the flowchart of FIG. 12A shows additional blocks that demonstrates one example of procedures that may be implemented in block 1004 of FIG. 10, in accordance with one or more embodiments.

In FIG. 12A, block 1004 includes blocks 1202-1106. At block 1202, a semiconductor substrate is formed wherein the semiconductor substrate comprises a first semiconductor substrate segment having first functional circuitry and a second semiconductor substrate segment having a first ESD clamp circuit. In some embodiments, first semiconductor substrate corresponds to semiconductor substrate 303 in FIGS. 3, 4 and semiconductor substrate 603 in FIGS. 6, 7. In some embodiments, first semiconductor substrate segment corresponds to semiconductor substrate segment 308 in FIGS. 3, 4 and semiconductor substrate segment 608 in FIGS. 6, 7. In some embodiments, first functional circuitry correspond to functional circuitry 112 in FIGS. 3, 4 and FIGS. 6, 7. In some embodiments, second semiconductor substrate segment corresponds to semiconductor substrate segments 310, 312 in FIGS. 3, 4 and semiconductor substrate segment 610 FIGS. 6, 7. In some embodiments, ESD clamp circuit corresponds to ESD clamp circuits 120, 122 in FIGS. 3, 4 and FIGS. 6, 7.

At block 1204, one or more first front side conductors and one or more first front side metal vias are formed wherein the one or more first front side conductors and one or more first front side metal vias connect the first buried connection tower that are formed later to the first functional circuitry in the first semiconductor substrate segment and to the first ESD clamp circuit in the second semiconductor substrate segment. In some embodiments, the one or more first front side conductors and one or more first front side metal vias correspond to front side conductors and front side vias 332, 333 in FIGS. 3, 4 and front side conductors and front side vias 632 in FIGS. 6, 7.

At block 1206, first connection tower is formed that connects to an input/output pad. In some embodiments, first connection tower corresponds to buried connection tower 318 in FIGS. 3, 4 and buried connection tower 618 in FIGS. 6, 7.

Figure 12B:
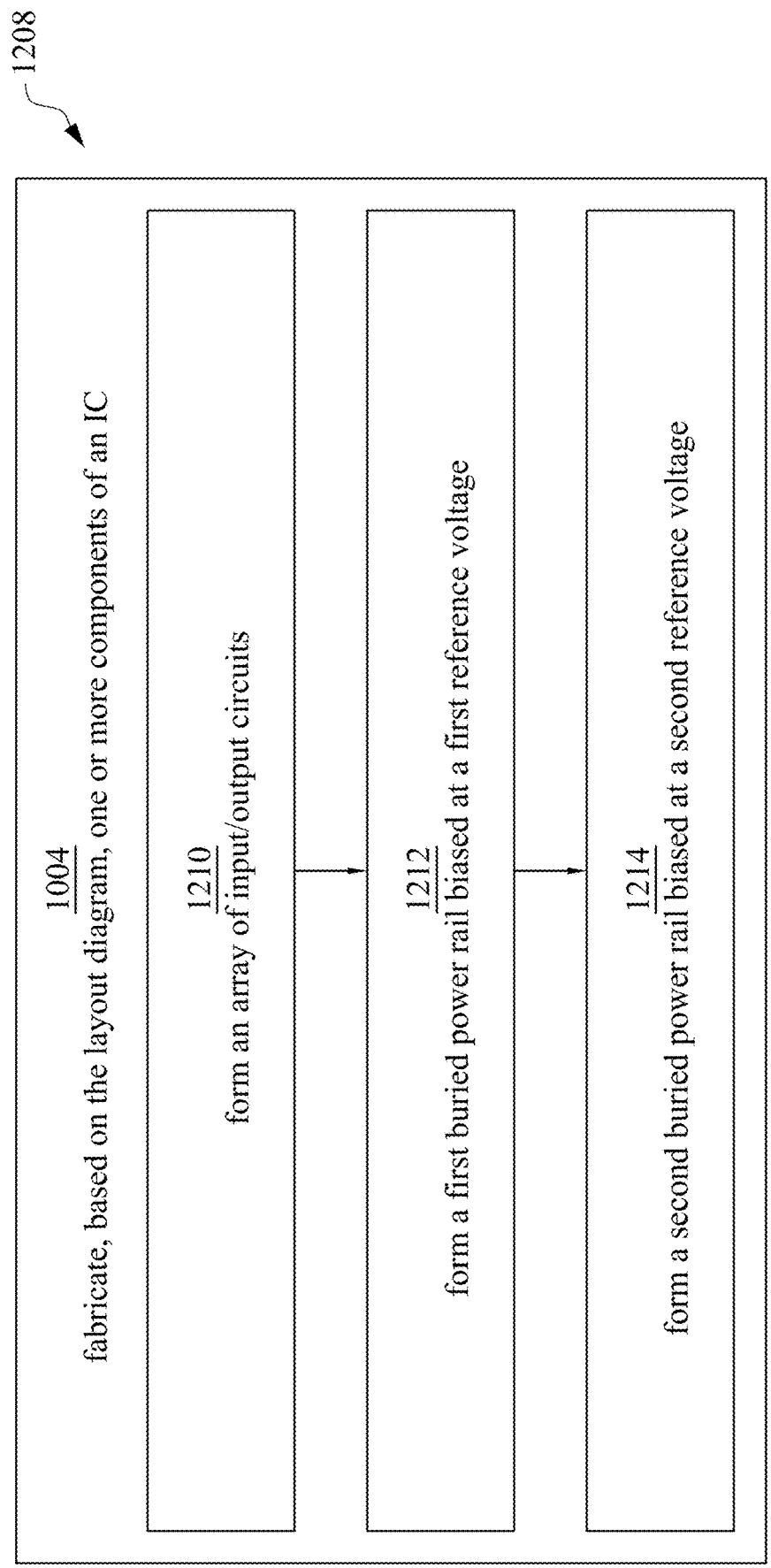
FIG. 12B is a flowchart of a method of fabrication, based on the layout diagram, of at least one component of an IC, in accordance with some embodiments.

FIG. 12B is a flowchart of a method 1208 of fabricate, based on the layout diagram, at least one component of an IC, in accordance with some embodiments.

More particularly, the flowchart of FIG. 12B shows additional blocks that demonstrates one example of procedures that may be implemented in block 1004 of FIG. 10, in accordance with one or more embodiments.

In FIG. 12B, block 1004 includes blocks 1210-1214. At block 1210, an array of input/output circuits are formed. Each of the input output circuits includes an input/output terminal of an internal functional circuit, a first ESD clamp circuit connected between the input/output terminal and the first power rail, a second ESD clamp circuit connected between the input/output terminal and the second power rail, and a third ESD clamp circuit connected at a first end to a first node between the first buried power rail and the first ESD clamp circuit, and at a second end to a second node between the second buried power rail and the second ESD clamp circuit. In some embodiments, the first buried power rail corresponds to buried power rail 212 in FIG. 5. In some embodiments, the second buried power rail corresponds to buried power rail 214 in FIG. 5.

In some embodiments, array of input/output circuits corresponds to the array of input/output circuits 502 in FIG. 5. In some embodiments, first ESD clamp circuit corresponds to PU ESD clamp circuit 208 in FIG. 5. In some embodiments, second ESD clamp circuit corresponds to PD ESD clamp circuit 210 in FIG. 5. In some embodiments, third ESD clamp circuit corresponds to PG ESD clamp circuit 504 in FIG. 5.

At block 1212, a first buried power rail biased at a first reference voltage is formed. In some embodiments, first buried power rail corresponds to the buried power rail 212 that is biased at the reference voltage VDD in FIG. 5.

At block 1214, a second buried power rail biased at a second reference voltage is formed. In some embodiments, second buried power rail corresponds to the buried power rail 214 that is biased at the reference voltage VSS in FIG. 5.

Figure 12C:
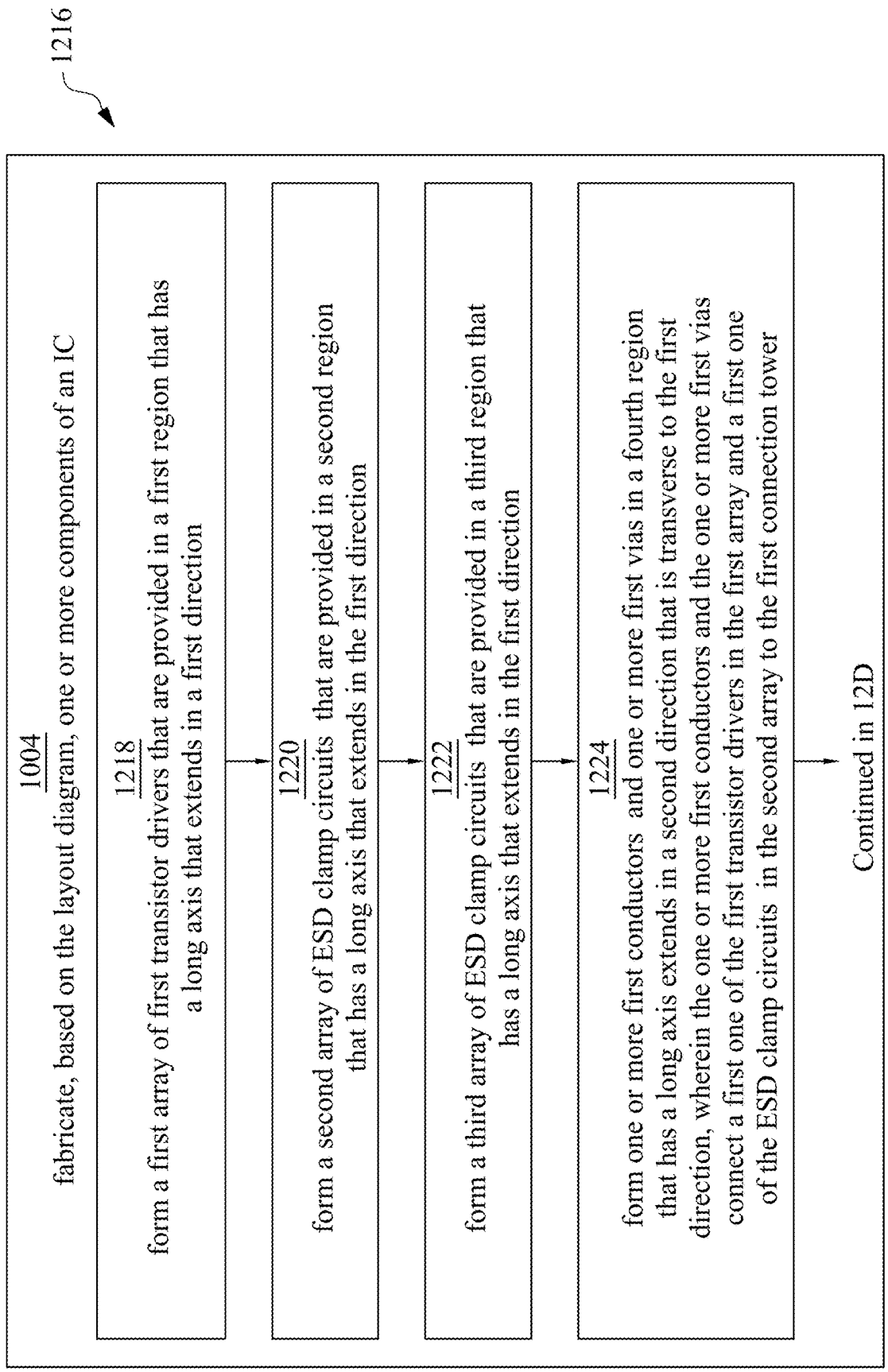
FIGS. 12C-12D are a flowchart of a method of fabrication, based on the layout diagram, of at least one component of an IC, in accordance with some embodiments.
Figure 12D:
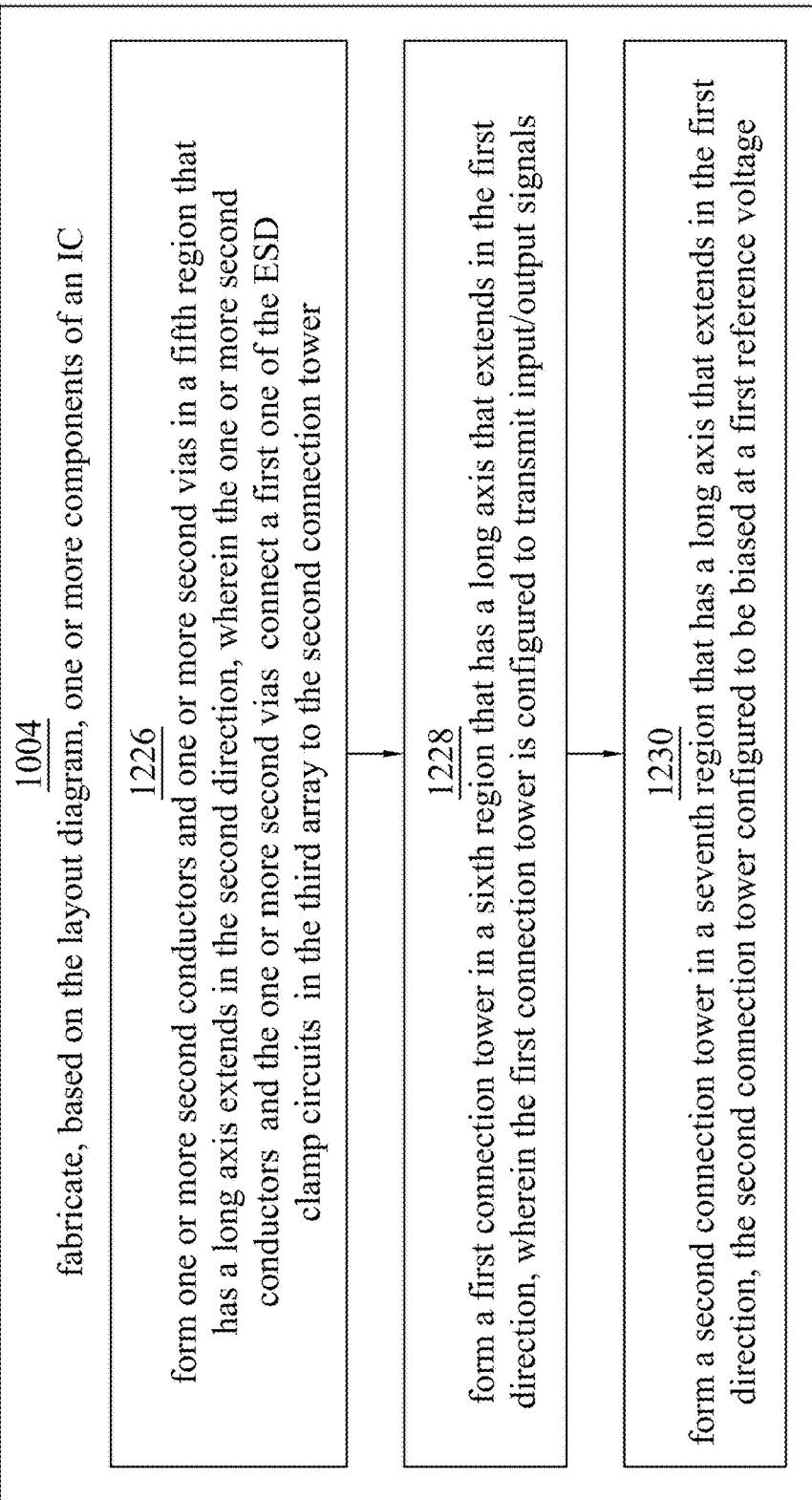

FIGS. 12C-12D are a flowchart of a method 1216 of fabricate, based on the layout diagram, at least one component of an IC, in accordance with some embodiments.

More particularly, the flowchart of FIGS. 12C-12D show additional blocks that demonstrates one example of procedures that may be implemented in block 1004 of FIG. 10, in accordance with one or more embodiments.

In FIGS. 12C-12D, block 1004 includes blocks 1218-1230. At block 1218, a first array of first transistor drivers are formed that are provided in a first region that has a long axis that extends in a first direction. In some embodiments, first array of first transistor drivers that are provided in a first region corresponds the array of transistor drivers in region 808 in FIG. 8 and in region 906 in FIG. 9.

At block 1220, a second array of ESD clamp circuits are formed that are provided in a second region that has a long axis that extends in the first direction. In some embodiments, second array of ESD clamp circuits that are provided in a second region corresponds to the array of ESD clamp circuits in region 804 in FIG. 8 and in region 910 in FIG. 9.

At block 1222, a third array of ESD clamp circuits are formed that are provided in a third region that has a long axis that extends in the first direction. In some embodiments, third array of ESD clamp circuits are provided in a third region corresponds to the array of ESD clamp circuits in region 818 in FIG. 8 and in region 910 in FIG. 9.

At block 1224, one or more first conductors and one or more first vias are formed in a fourth region that has a long axis extends in a second direction that is transverse to the first direction, wherein the one or more first conductors and the one or more first vias connect a first one of the first transistor drivers in the first array and a first one of the ESD clamp circuits in the second array to the first connection tower. In some embodiments, one or more first conductors and one or more first vias in a fourth region corresponds to the conductors and vias 826 in region 822 in FIG. 8 and conductors and vias 932 in region 924 in FIG. 9.

At block 1226, one or more second conductors and one or more second vias are formed in a fifth region that has a long axis extends in a second direction that is transverse to the first direction, wherein the one or more second conductors and the one or more second vias connect a first one of the ESD clamp circuits in the third array to the second connection tower. In some embodiments, one or more second conductors and one or more second vias in a fifth region corresponds to the conductors and via shapes 832 in region 824 in FIG. 8 and conductors and via shapes 928 in region 922 in FIG. 9.

At block 1228, a first connection tower is formed in a sixth region that has a long axis that extends in the first direction, wherein the first connection tower is configured to transmit input/output signals. In some embodiments, a first connection tower in a sixth region corresponds to the connection tower in region 802 in FIG. 8 and in region 912 in FIG. 9.

At block 1230, a second connection tower is formed in a seventh region that has a long axis that extends in the first direction, the second connection tower configured to be biased at a first reference voltage. In some embodiments, a second connection tower in a seventh region corresponds to the connection tower in region 810 in FIG. 8 and in region 916 in FIG. 9.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EAD system is usable as part of a design house of an IC manufacturing system discussed below.

Figure 13:
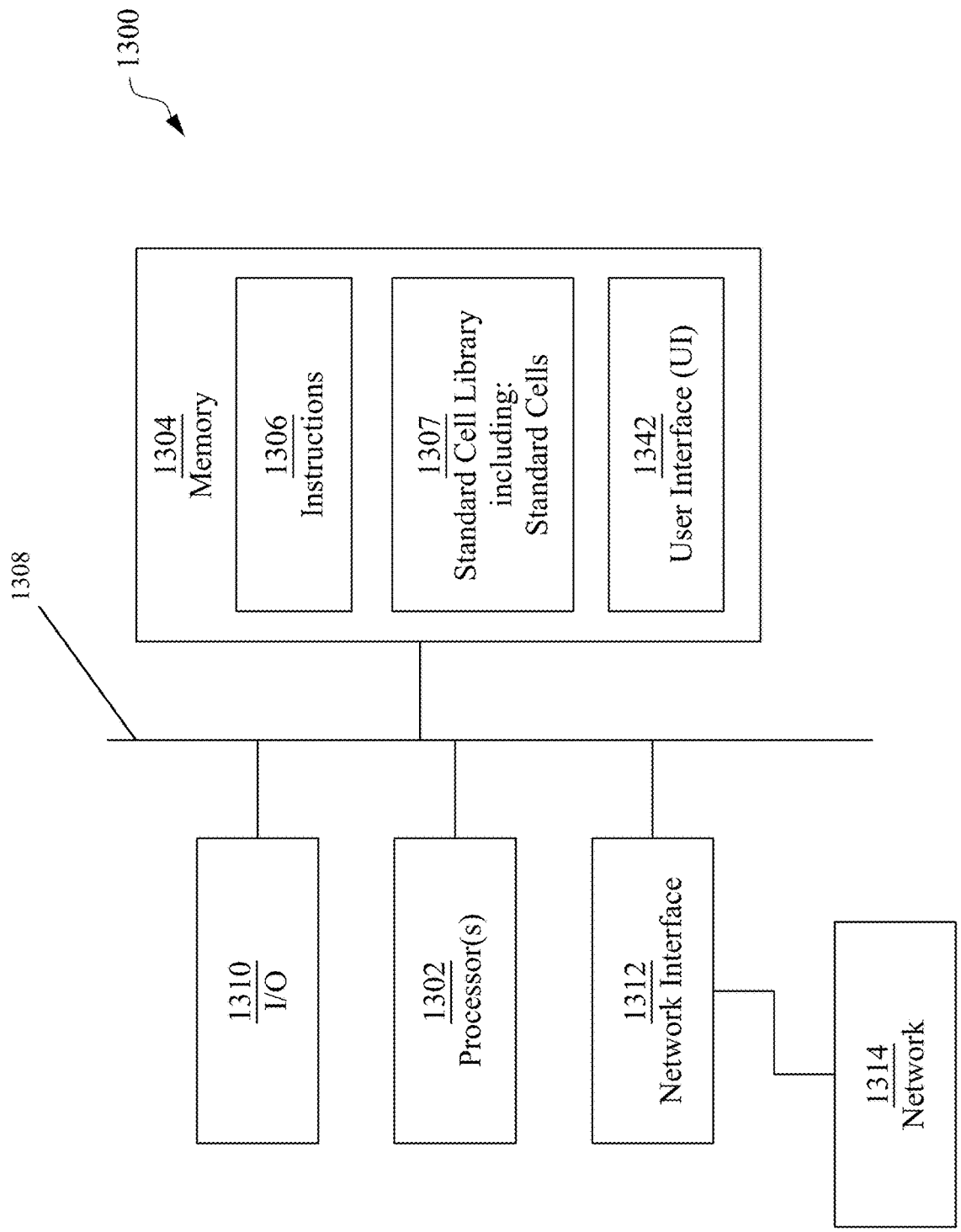
FIG. 13 is a block diagram of an electronic design automation (EDA) system in accordance with some embodiments.

FIG. 13 is a block diagram of an electronic design automation (EDA) system 1300 in accordance with some embodiments. The EDA system 1300 is configured to generate a layout diagram as described above with respect to FIG. 11A-11D.

In some embodiments, EDA system 1300 includes an APR system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including at least one hardware processor 1302 and a non-transitory, computer-readable storage medium 1304. Storage medium 1304, amongst other things, is encoded with, i.e., stores, computer program code 1306, i.e., a set of computer-executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows EDA system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

EDA system 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
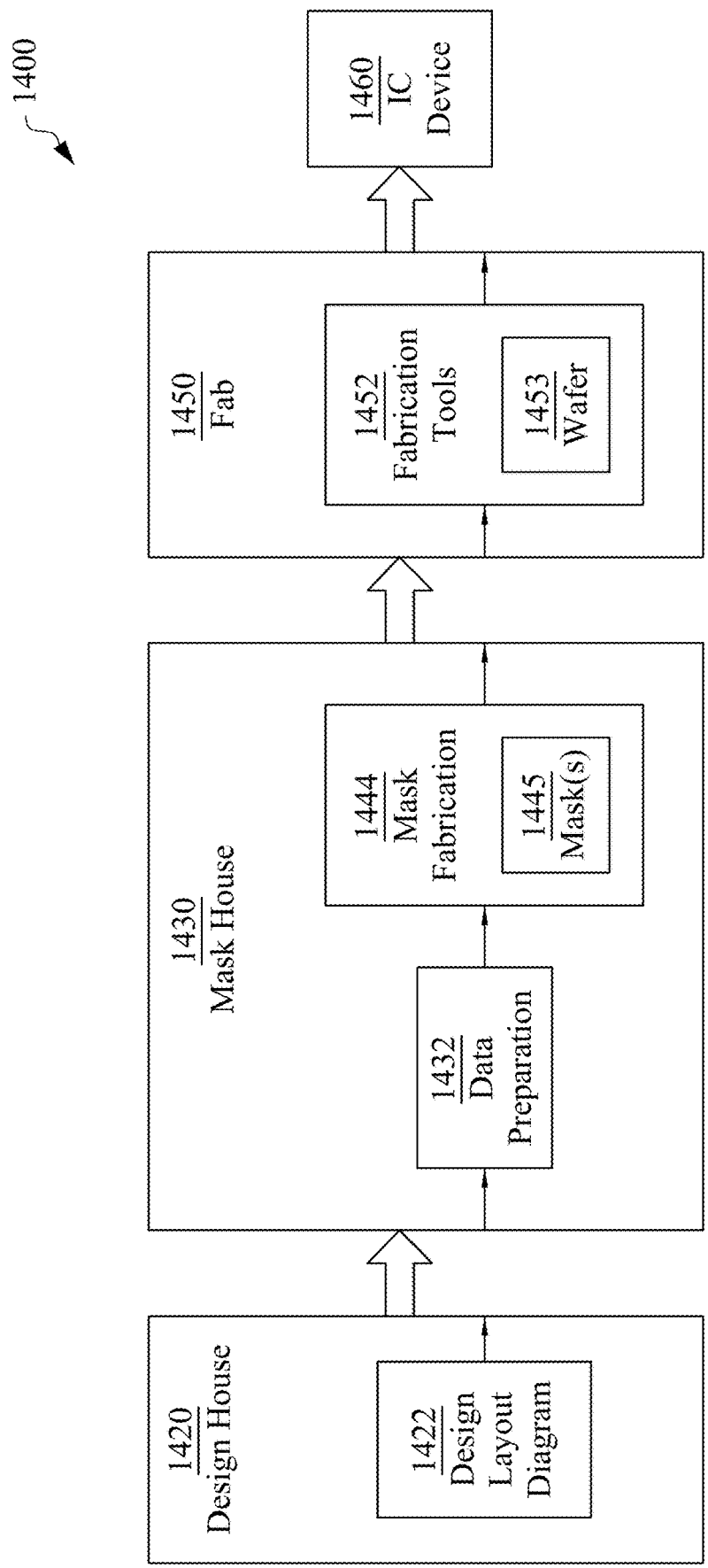
FIG. 14 is a block diagram of an integrated circuit (IC) manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments.

The manufacturing system 1400 is configured to manufacture the IC device 100 in FIG. 1, IC device 200 in FIG. 2, IC device 300 in FIG. 3, IC device 400 in FIG. 4, IC device 500 in FIG. 5, IC module 600 in FIG. 6, IC module 700 in FIG. 7, IC device 800 in FIG. 8, and IC device 900 in FIG. 9 described above. The IC manufacturing system 1400 is also configured to perform procedure 1004 in FIG. 10, including the procedures described in FIGS. 12A-12D.

In some embodiments, based on a layout diagram, e.g., at least one of (A) one or more semiconductor masks or (B) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL)

fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multilevel interconnects, and the like (formed at subsequent manufacturing steps).

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device, includes a semiconductor substrate comprising a first semiconductor substrate segment having first functional circuitry and a second semiconductor substrate segment having a first electrostatic discharge (ESD) clamp circuit; a first connection tower that connects to an input/output pad; and one or more first front side conductors and one or more first front side metal vias, wherein the one or more first front side conductors and one or more first front side metal vias connect the first buried connection tower to the first functional circuitry in the first semiconductor substrate segment and to the first ESD clamp circuit in the second semiconductor substrate segment.

In some embodiments, an integrated circuit (IC) device, includes a first buried power rail configured to be biased at a first reference voltage; a second buried power rail configured to be biased at a second reference voltage; and an array of input/output circuits, each comprising an input/output terminal of an internal functional circuit; a first electrostatic discharge (ESD) clamp circuit connected between the input/output terminal and the first buried power rail; a second ESD clamp circuit connected between the input/output terminal and the second buried power rail; and a third ESD clamp circuit connected at a first end to a first node between the first buried power rail and the first ESD clamp circuit, and at a second end to a second node between the second buried power rail and the second ESD clamp circuit.

In some embodiments, an integrated circuit (IC) device, comprising: a first array of first transistor drivers that are provided in a first region that has a long axis that extends in a first direction; a second array of electrostatic discharge (ESD) clamp circuits that are provided in a second region that has a long axis that extends in the first direction; a third array of ESD clamp circuits that are provided in a third region that has a long axis that extends in the first direction; a first connection tower in a fourth region that has a long axis that extends in the first direction, wherein the first connection tower is configured to transmit input/output signals; a second connection tower in a fifth region that has a long axis that extends in the first direction, the second connection tower configured to be biased at a first reference voltage; one or more first conductors and one or more first vias in a sixth region that has a long axis extends in a second direction that is transverse to the first direction, wherein the one or more first conductors and the one or more first vias connect a first one of the first transistor drivers in the first array and a first one of the ESD clamp circuits in the second array to the first connection tower; one or more second conductors and one or more second vias in a seventh region that has a long axis extends in the second direction, wherein the one or more second conductors and the one or more second vias connect a first one of the ESD clamp circuits in the third array to the second connection tower; wherein: the sixth region overlaps the first region, the second region, and the fourth region; and the seventh region overlaps the third region and the fifth region and is displaced with respect to the first direction with the sixth region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
   a substrate comprising a first substrate segment having first functional circuitry and a second substrate segment having a first electrostatic discharge (ESD) clamp circuit;
   a first connection tower that connects to an input/output pad; and
   one or more first front side conductors and one or more first front side metal vias, wherein the one or more first front side conductors and one or more first front side metal vias connect the first connection tower to the first functional circuitry in the first substrate segment and to the first ESD clamp circuit in the second substrate segment,
   wherein no other connection tower other than the first connection tower connects the input/output pad to the first functional circuitry in the first substrate segment and to the first ESD clamp circuit in the second substrate segment.

2. The IC device of claim 1, wherein:
   the substrate further comprises a third substrate segment, the first connection tower comprises a first end, a second end, and a buried stack of metal segments connected by a plurality of buried vias between the first end and the second end, the first end of the first connection tower is located in the third substrate segment and is connected to the one or more first front side conductors and one or more first front side metal vias, and the buried stack of metal segments connected by the plurality of buried vias are connected to the input/output pad at the second end of the first connection tower.

3. The IC device of claim 1, further comprising:
a first buried power rail configured to be biased at a first reference voltage;
a second connection tower that is connected to the first buried power rail; and
one or more second front side conductors and one or more second front side vias that connect the second connection tower to the first ESD clamp circuit.

4. The IC device of claim 1, wherein the first connection tower comprises a first buried connection tower.

5. The IC device of claim 3, further comprising:
a second buried power rail configured to be biased at a second reference voltage;
a second ESD clamp circuit, wherein the substrate further comprises a third substrate segment that includes the second ESD clamp circuit;
a third connection tower that is connected to the first buried power rail;
one or more third front side metal conductors and one or more third front side vias that connect the third connection tower to the second ESD clamp circuit in the third substrate segment;
a fourth connection tower that is connected to the second buried power rail; and
one or more fourth front side metal conductors and one or more fourth front side vias that connect the fourth connection tower to the second ESD clamp circuit in the third substrate segment.

6. The IC device of claim 5, further comprising:
a third ESD clamp circuit, wherein the substrate further comprises a fourth substrate segment that includes the third ESD clamp circuit;
one or more fifth front side metal conductors and one or more fifth front side vias that connect the first connection tower to the third ESD clamp circuit in the fourth substrate segment; and
one or more sixth front side metal conductors and one or more sixth front side vias that connect the fourth connection tower to the third ESD clamp circuit in the fourth substrate segment.

7. The IC device of claim 1, further comprising:
a first buried power rail configured to be biased at a first reference voltage;
a second connection tower that is connected to the first buried power rail; and
one or more second front side conductors and one or more front side vias that connect the second connection tower to the first functional circuitry.

8. The IC device of claim 7, further comprising:
a second ESD clamp circuit, wherein the substrate further comprises a third substrate segment that includes the second ESD clamp circuit; and
one or more third front side conductors and one or more third front side vias that connect the first ESD clamp circuit and the second ESD clamp circuit to the second connection tower, wherein the first reference voltage is a power source voltage and wherein the one or more third front side conductors and the one or more third front side vias are configured to be biased at the power source voltage from the first buried power rail.

9. The IC device of claim 8, further comprising:
a second buried power rail configured to be biased at a second reference voltage, wherein the second reference voltage is a ground voltage;
a third connection tower that is connected to the second buried power rail; and
one or more fourth front side conductors and one or more fourth front side vias that connect the second ESD clamp circuit to the third connection tower, wherein the one or more fourth front side conductors and the one or more fourth front side vias are configured to be biased at the ground voltage.

10. The IC device of claim 9, further comprising:
a third ESD clamp circuit, wherein the substrate further comprises a fourth substrate segment that includes the third ESD clamp circuit;
one or more fourth front side connectors that connect the third ESD clamp circuit to the first buried power rail; and
one or more fifth front side connectors that connect the third ESD clamp circuit to the second buried power rail.

11. The IC device of claim 8, further comprising:
a transistor driver, wherein the substrate further comprises a fourth substrate segment that includes the transistor driver;
one or more fourth front side conductors and one or more fourth front side vias that connect the transistor driver to the first connection tower; and
one or more fifth front side conductors and one or more fifth front side vias that connect the transistor driver to the second connection tower.

12. An integrated circuit (IC) device, comprising:
a first buried power rail configured to be biased at a first reference voltage;
a second buried power rail configured to be biased at a second reference voltage;
an array of input/output circuits, each comprising:
an input/output terminal of an internal functional circuit;
a first electrostatic discharge (ESD) clamp circuit connected between the input/output terminal and the first buried power rail;
a second ESD clamp circuit connected between the input/output terminal and the second buried power rail; and
a third ESD clamp circuit connected at a first end to a first node between the first buried power rail and the first ESD clamp circuit, and at a second end to a second node between the second buried power rail and the second ESD clamp circuit;
at least one of
a first power rail ESD circuit connected between the first buried power rail and the second buried power rail, at a first end of the array of input/output circuits, or
a second power rail ESD circuit connected between the first buried power rail and the second buried power rail, at a second end of the array of input/output circuits,
wherein the at least one of the first power rail ESD circuit or the second power rail ESD circuit is different from the third ESD clamp circuit in each of the input/output circuits in the array; and for each of the input/output circuits in the array, a first connection tower connected to the input/output terminal, wherein
the first connection tower comprises a first end, a second end, and a buried stack of metal segments connected by a plurality of buried vias between the first end and the second end,
the first end of the first connection tower is connected to one or more first front side conductors and one or more first front side metal vias on a front side of a substrate, and
the buried stack of metal segments connected by the plurality of buried vias are connected to the input/output terminal at the second end of the first connection tower on a back side of the substrate.

13. The IC device of claim 12, comprising both the first power rail ESD circuit and the second power rail ESD circuit each of which is different from the third ESD clamp circuit in each of the input/output circuits in the array.

14. The IC device of claim 12, wherein
the first buried power rail, the second buried power rail and the input/output terminal in each of the input/output circuits in the array are on the back side of the substrate, and
the internal functional circuit and the first ESD clamp circuit, the second ESD clamp circuit, and the third ESD clamp circuit in each of the input/output circuits are on the front side of the substrate, and are connected to each other on the front side of the substrate.

15. An integrated circuit (IC) device, comprising:
a first array of first transistor drivers that are provided in a first region that has a long axis that extends in a first direction;
a second array of electrostatic discharge (ESD) clamp circuits that are provided in a second region that has a long axis that extends in the first direction;
a third array of ESD clamp circuits that are provided in a third region that has a long axis that extends in the first direction;
a first connection tower in a fourth region that has a long axis that extends in the first direction, wherein the first connection tower is configured to transmit input/output signals;
a second connection tower in a fifth region that has a long axis that extends in the first direction, the second connection tower configured to be biased at a first reference voltage;
one or more first conductors and one or more first vias in a sixth region that has a long axis that extends in a second direction that is transverse to the first direction, wherein the one or more first conductors and the one or more first vias connect a first one of the first transistor drivers in the first array and a first one of the ESD clamp circuits in the second array to the first connection tower; and
one or more second conductors and one or more second vias in a seventh region that has a long axis that extends in the second direction, wherein the one or more second conductors and the one or more second vias connect a first one of the ESD clamp circuits in the third array to the second connection tower;
wherein:
the sixth region overlaps the first region, the second region, and the fourth region; and
the seventh region overlaps the third region and the fifth region and is displaced from the sixth region in the first direction.

16. The IC device of claim 12, further comprising:
for each of the input/output circuits in the array,
a second connection tower connected to the first buried power rail; and
one or more second front side conductors and one or more second front side vias that connect the second connection tower to the first ESD clamp circuit.

17. The IC device of claim 15, further comprising:
a fourth array of ESD clamp circuits that are provided in an eighth region that has a long axis that extends in the first direction;
a fifth array of second transistor drivers that are provided in a ninth region that has a long axis that extends in the first direction; and
a third connection tower in a tenth region that has a long axis that extends in the first direction, the third connection tower configured to be biased at the first reference voltage;
wherein the one or more first conductors and the one or more first vias connect a first one of the ESD clamp circuits in the fourth array and a first one of the second transistor drivers in the fifth array to the third connection tower.

18. The IC device of claim 17, further comprising:
a fourth connection tower in an eleventh region that has a long axis that extends in the first direction, the fourth connection tower configured to be biased at a second reference voltage different than the first reference voltage; and
one or more third conductors and one or more third vias in a twelfth region that has a long axis that extends in the second direction, wherein the one or more third conductors and the one or more third vias connect the first one of the first transistor drivers in the first array, the first one of the ESD clamp circuits in the second array, and the first one of the ESD clamp circuits in the third array to the fourth connection tower.

19. The IC device of claim 18, wherein, relative to the second direction, the regions are ordered as, the eleventh region, the fifth region, the second region, the first region, the third region, the fourth region, the eighth region, the tenth region and the ninth region.

20. The IC device of claim 18, wherein, relative to the second direction, the regions are ordered as, the fifth region, the second region, the first region, the eleventh region, the third region, the fourth region, the eighth region, the tenth region and the ninth region.

* * * * *